(12) United States Patent
Ikeda et al.

(10) Patent No.: US 8,969,896 B2
(45) Date of Patent: Mar. 3, 2015

(54) LIGHT-EMITTING ELEMENT, LIGHT-EMITTING DEVICE, AND LIGHTING DEVICE

(75) Inventors: Hisao Ikeda, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 609 days.

(21) Appl. No.: 13/277,566

(22) Filed: Oct. 20, 2011

(65) Prior Publication Data

US 2012/0097991 A1    Apr. 26, 2012

(30) Foreign Application Priority Data

Oct. 22, 2010  (JP) .................................. 2010-237647

(51) Int. Cl.
   *H01L 51/50*   (2006.01)
   *H01L 33/58*   (2010.01)
   *H01L 51/52*   (2006.01)
   *H01L 51/00*   (2006.01)

(52) U.S. Cl.
   CPC ............ *H01L 51/5275* (2013.01); *H01L 51/00* (2013.01)
   USPC .............................................. 257/98; 257/40

(58) Field of Classification Search
   USPC .............. 257/98, 100, 40, E51.018, E51.021, 257/E51.02, E33.067–E33.074; 313/504, 313/512
   See application file for complete search history.

(56) References Cited

U.S. PATENT DOCUMENTS 5,962,962 A   10/1999  Fujita et al.
7,859,627 B2  12/2010  Nishida et al.
(Continued)

FOREIGN PATENT DOCUMENTS

CN   102047449 A   5/2011
EP   2 264 791 A1  12/2010
(Continued)

OTHER PUBLICATIONS

Reineke, S. et al, "White Organic Light-Emitting Diodes with Fluorescent Tube Efficiency," Nature, vol. 459, May 14, 2009, pp. 234-239.

(Continued)

*Primary Examiner* — Matthew W Such
*Assistant Examiner* — Scott Stowe
(74) *Attorney, Agent, or Firm* — Husch Blackwell LLP

(57) ABSTRACT

Described is a solid-state light-emitting element, a light-emitting device using the solid-state light-emitting element, and a lighting device using the light-emitting device. The solid-state light-emitting element comprises a member with a low refractive index which has a hemispherical structure on a first surface and an uneven structure on a second surface, a bonding layer with a high refractive index which planarizes the uneven structure, and a light-emitting body whose light-emitting surface is in contact with a flat surface of the bonding layer. The uneven structure of the member with a low refractive index is provided inside at least an outside shape of the hemispherical structure formed on the first surface; and the light-emitting body is provided such that an outside shape of the light-emitting region of the light-emitting body is smaller than the outside shape of the hemispherical structure and overlaps with the hemispherical structure.

28 Claims, 10 Drawing Sheets

(56) References Cited

U.S. PATENT DOCUMENTS

| | | |
|---|---|---|
| 2005/0258436 A1 | 11/2005 | Arai |
| 2008/0129184 A1 | 6/2008 | Nishida et al. |
| 2008/0129933 A1 | 6/2008 | Nishida et al. |
| 2008/0130122 A1 | 6/2008 | Egi et al. |
| 2011/0006323 A1 | 1/2011 | Suzuki et al. |
| 2011/0134647 A1 | 6/2011 | Nishida et al. |
| 2011/0222280 A1* | 9/2011 | Kim ............................. 362/235 |
| 2012/0061707 A1* | 3/2012 | Seo et al. ...................... 257/98 |
| 2012/0061708 A1* | 3/2012 | Ikeda et al. ................... 257/98 |

FOREIGN PATENT DOCUMENTS

| | | |
|---|---|---|
| JP | 63-134562 | 9/1988 |
| JP | 2005-317228 | 11/2005 |
| JP | 2007-173424 | 7/2007 |
| JP | 2009-238960 | 10/2009 |
| JP | 2010-238846 | 10/2010 |
| KR | 10-2010-0123763 | 11/2010 |
| WO | WO 2009/119733 A1 | 10/2009 |

OTHER PUBLICATIONS

PCT International Search Report for application PCT/JP2011/074083, mailed Dec. 6, 2011.

PCT Written Opinion of the International Search Authority for application PCT/JP2011/074083, mailed Dec. 6, 2011.

* cited by examiner

LIGHT-EMITTING ELEMENT, LIGHT-EMITTING DEVICE, AND LIGHTING DEVICE

TECHNICAL FIELD

The present invention relates to a light-emitting element, a light-emitting device including the light-emitting element, and a lighting device including the light-emitting device.

BACKGROUND ART

In a solid-state light-emitting element which emits light in a region whose refractive index is higher than that of the air, part of light emitted in the inside of the light-emitting element is totally reflected at an interface with the air in a certain condition. As a result, efficiency in extracting light from the inside of the solid-state light-emitting element to the air side does not reach 100%.

For solving this problem, a structure in which a structure body (e.g., an uneven structure) is formed on a surface of a solid-state light-emitting element has been reported.

For example, Non-Patent Document 1 discloses a structure in which a high refractive index glass substrate and a high refractive index lens are combined and a structure in which an uneven structure is provided at an interface between a high refractive index glass substrate and the air, where light extraction efficiency of a light-emitting element is improved.

REFERENCE

Non-Patent Document

[Non-Patent Document 1] "White organic light-emitting diodes with fluorescent tube efficiency", Nature, May 14, 2009, Vol. 459, pp. 234-239

DISCLOSURE OF INVENTION

Few kinds of materials have both capability of transmitting visible light and a high refractive index, and moreover, such a material (e.g., glass or a resin) is expensive. Accordingly, a light-emitting element to which the structure disclosed in Non-Patent Document 1 is applied costs much.

The present invention is made in view of the foregoing technical background. Therefore, an object of one embodiment of the present invention is to provide a solid-state light-emitting element that has high light extraction efficiency with the use of an inexpensive material. In addition, an object of one embodiment of the present invention is to provide a highly efficient light-emitting device including the solid-state light-emitting element or a highly efficient lighting device including the light-emitting device.

In order to achieve the above object, the present invention focused on the use amount of a material with a high refractive index, an optical member with a low refractive index, and a position of a light-emitting body with respect to the optical member.

The present inventors have reached a structure in which a member with a low refractive index which has a hemispherical structure on a first surface and an uneven structure on a second surface, a bonding layer with a high refractive index which planarizes the uneven structure, and a light-emitting body whose light-emitting surface is in contact with a flat surface of the bonding layer with a high refractive index are included; the uneven structure of the member with a low refractive index is provided inside at least an outside shape of the hemispherical structure formed on the first surface; and the light-emitting body is provided such that an outside shape of a light-emitting region of the light-emitting body is smaller than the outside shape of the hemispherical structure and overlaps with the hemispherical structure, and this structure can solve the object.

The light-emitting surface of the light-emitting body is in contact with the flat surface of the bonding layer with a high refractive index, whereby light from the light-emitting body can be efficiently extracted to the bonding layer with a high refractive index. Further, the member with a low refractive index is in contact with the bonding layer with a high refractive index with an interface at which the uneven structure is formed provided therebetween, whereby light transmitted through the bonding layer with a high refractive index can be efficiently extracted to the member with a low refractive index. In addition, an effect of reducing the use amount of a material with a high refractive index is brought about. Furthermore, the outside shape of the light-emitting region of the light-emitting body overlaps with the hemispherical structure of the member with a low refractive index and is smaller than the outside shape of the hemispherical structure, whereby light transmitted through the member with a low refractive index can be efficiently extracted to the air.

That is, one embodiment of the present invention is a light-emitting element which includes the following: a member with a low refractive index having a hemispherical structure on a first surface and an uneven structure on a second surface; a bonding layer with a high refractive index planarizing the uneven structure and having a higher refractive index than the member with a low refractive index; and a light-emitting body having a light-emitting surface in contact with a flat surface of the bonding layer with a high refractive index. The uneven structure of the member with a low refractive index is provided inside at least an outside shape of the hemispherical structure formed on the first surface. The light-emitting body is provided such that an outside shape of a light-emitting region of the light-emitting body which is projected on a surface including the light-emitting surface is smaller than the outside shape of the hemispherical structure and overlaps with the hemispherical structure.

According to the above embodiment of the present invention, the uneven structure or the hemispherical structure is provided at an interface at which a region with a high refractive index and a region with a low refractive index are in contact. With this structure, light from the light-emitting body with a high refractive index can be efficiently extracted through the member with a low refractive index to the air with a lower refractive index. Moreover, the use amount of a material with a high refractive index can be reduced. This can reduce manufacturing cost.

Further, one embodiment of the present invention is the light-emitting element, in which a refractive index of the hemispherical structure is n; the outside shape of the light-emitting region of the light-emitting body which is projected on the surface including the light-emitting surface is concentric with the outside shape of the hemispherical structure which is projected on the surface including the light-emitting surface; the outside shape of the light-emitting region of the light-emitting body which is projected on the surface including the light-emitting surface and the outside shape of the hemispherical structure are similar in shape; and the outside shape of the light-emitting region of the light-emitting body which is projected on the surface including the light-emitting surface is included in a range (1/n) times as large as the outside shape of the hemispherical structure.

According to the above embodiment of the present invention, total reflection of light is suppressed as much as possible, so that light emitted from the light-emitting body is extracted to the outside through the hemispherical structure.

Further, one embodiment of the present invention is the light-emitting element, in which the refractive index of the member with a low refractive index is higher than 1.0 and lower than 1.6, and the refractive index of the bonding layer with a high refractive index is higher than or equal to 1.6 and lower than or equal to 1.9.

According to the above embodiment of the present invention, there are a variety of materials with a refractive index of lower than 1.6 which can be applied to the member with a low refractive index, and such materials can be purchased at relatively low cost. This can reduce manufacturing cost. Further, a refractive index difference with the air is small, which enables efficient extraction of light to the air. Furthermore, when the bonding layer with a high refractive index has a refractive index of higher than or equal to 1.6 and lower than or equal to 1.9, light emitted from the solid-state light-emitting body whose refractive index is in a range of higher than or equal to 1.6 and lower than or equal to 1.9 can be efficiently extracted.

Further, one embodiment of the present invention is the light-emitting element further including a first electrode over the flat surface of the bonding layer with a high refractive index, a second electrode overlapping with the first electrode, and a layer containing a light-emitting organic substance between the first electrode and the second electrode, where the first electrode transmits light emitted by the light-emitting organic substance.

According to the above embodiment of the present invention, the first electrode is formed over the uneven structure which is planarized by the bonding layer with a high refractive index. Thus, generation of a short circuit between the first electrode and the second electrode which is due to the uneven structure can be suppressed; therefore, a highly reliable light-emitting element can be provided.

Further, one embodiment of the present invention is the light-emitting element further including a nitride film with a refractive index of higher than or equal to 1.6 and lower than or equal to 1.9 between the bonding layer with a high refractive index and the light-emitting body.

According to the above embodiment of the present invention, the nitride film with a refractive index of higher than or equal to 1.6 and lower than or equal to 1.9 is provided between the bonding layer with a high refractive index and the first electrode. Thus, without reducing light extraction efficiency, diffusion of an impurity to the solid-state light-emitting body can be prevented. For example, the light-emitting element with the structure is preferable for the following reason: an EL layer can be protected from entry of moisture contained in the member with a low refractive index or the bonding layer with a high refractive index in the case where the solid-state light-emitting element is an organic EL element.

Further, one embodiment of the present invention is the light-emitting element, in which the member with a low refractive index includes a support, a hemispherical structure on one surface of the support, and an uneven structure on the other surface, and a refractive index difference between the support and the hemispherical structure and a refractive index difference between the support and the uneven structure are each 0.15 or lower.

According to the above embodiment of the present invention, a refractive index difference between the support and the hemispherical structure and a refractive index difference between the support and the uneven structure each are suppressed to 0.15 or lower. Accordingly, reflection due to a refractive index difference at an interface is reduced and light emitted from the light-emitting body can be efficiently extracted to the outside through the hemispherical structure. Further, selection of a material used for the member with a low refractive index is facilitated, which can lead a reduction in manufacturing cost.

Further, one embodiment of the present invention is the light-emitting element, in which the member with a low refractive index includes a support, a hemispherical structure on one surface of the support, and an uneven structure on the other surface, and at least one of the hemispherical structure and the uneven structure is molded with the support.

According to the above embodiment of the present invention, a difference in optical properties is not caused between the support and the hemispherical structure and/or between the support and the uneven structure. Thus, light is not scattered at an interface inside the member with a low refractive index, so that light extraction efficiency can be improved. Further, since the structure can be formed in the same step as the support, the number of steps can be conveniently reduced.

Further, one embodiment of the present invention is a light-emitting device in which a plurality of the light-emitting elements are arranged.

According to the above embodiment of the present invention, a light-emitting device can be formed with the use of an inexpensive material and a plurality of solid-state light-emitting elements with high light extraction efficiency. Thus, a highly efficient light-emitting device can be provided.

Further, one embodiment of the present invention is a lighting device including the above-described light-emitting element.

According to the above embodiment of the present invention, a lighting device can be formed with the use of a highly efficient light-emitting device. Thus, a highly efficient lighting device can be provided.

Note that in this specification, an "EL layer" refers to a layer provided between a pair of electrodes in a light-emitting element. Thus, a light-emitting layer that is sandwiched between electrodes and contains a light-emitting organic compound is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that each of the substance A and the substance B may be one substance or a mixture of two or more kinds of substances.

Note that a light-emitting device in this specification refers to an image display device, and a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module including an IC (integrated circuit) directly mounted on a substrate provided with a light-emitting element by COG (chip on glass).

According to one embodiment of the present invention, a solid-state light-emitting element with high light extraction efficiency can be provided with the use of an inexpensive material. Alternatively, a highly efficient light-emitting device, or a highly efficient lighting device using the light-emitting device can be provided.

BEST MODE FOR CARRYING OUT THE INVENTION

Figure 1A:
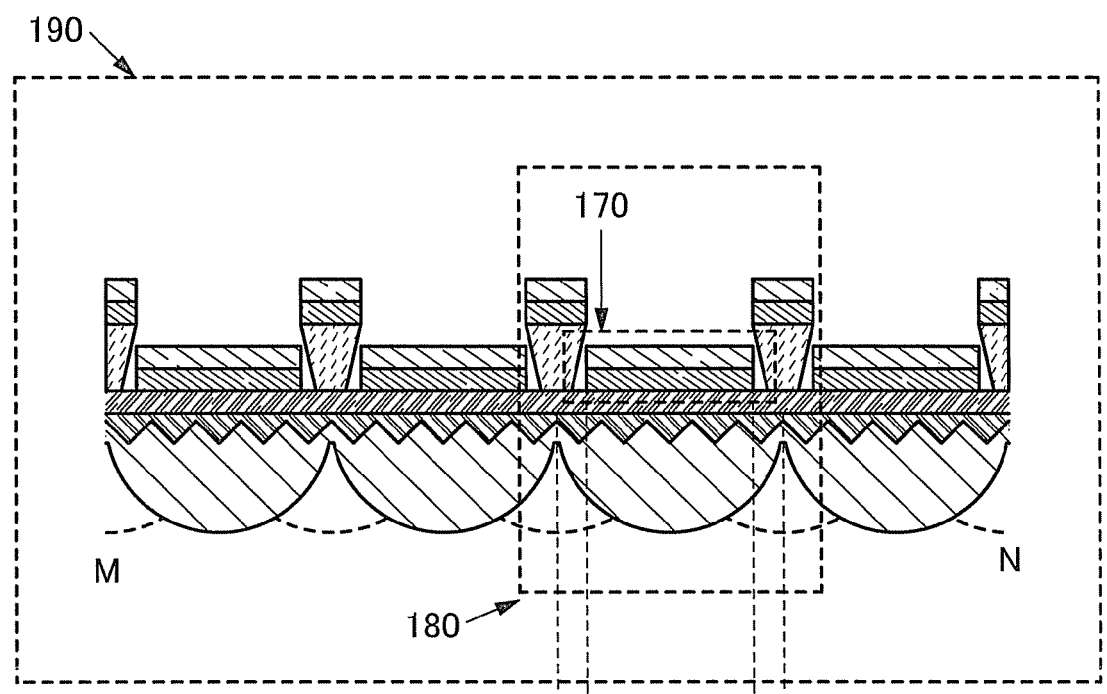
FIGS. 1A and 1B illustrate a structure of a solid-state light-emitting device according to one embodiment of the present invention.

Embodiments will be described in detail with reference to the drawings. Note that the present invention is not limited to the description below, and it is easily understood by those skilled in the art that various changes and modifications can be made without departing from the spirit and scope of the present invention. Therefore, the present invention should not be construed as being limited to the description in the embodiments. Note that in the structures of the present invention described below, the same portions or portions having similar functions are denoted by the same reference numerals in different drawings, and description of such portions is not repeated.

Embodiment 1

In this embodiment, a solid-state light-emitting element, and a light-emitting device in which a plurality of the solid-state light-emitting elements are arrayed are described with reference with FIGS. 1A and 1B, FIGS. 2A to 2D, FIGS. 3A and 3B, and FIGS. 4A to 4C. The solid-state light-emitting element includes a member with a low refractive index which has a hemispherical structure on a first surface and an uneven structure on a second surface, a bonding layer with a high refractive index which planarizes the uneven structure, and a light-emitting body whose light-emitting surface is in contact with a flat surface of the bonding layer with a high refractive index. The uneven structure of the member with a low refractive index is provided inside at least an outside shape of the hemispherical structure formed on the first surface. The light-emitting body is provided such that an outside shape of a light-emitting region of the light-emitting body is smaller than the outside shape of the hemispherical structure and overlaps with the hemispherical structure.

Figure 1B:
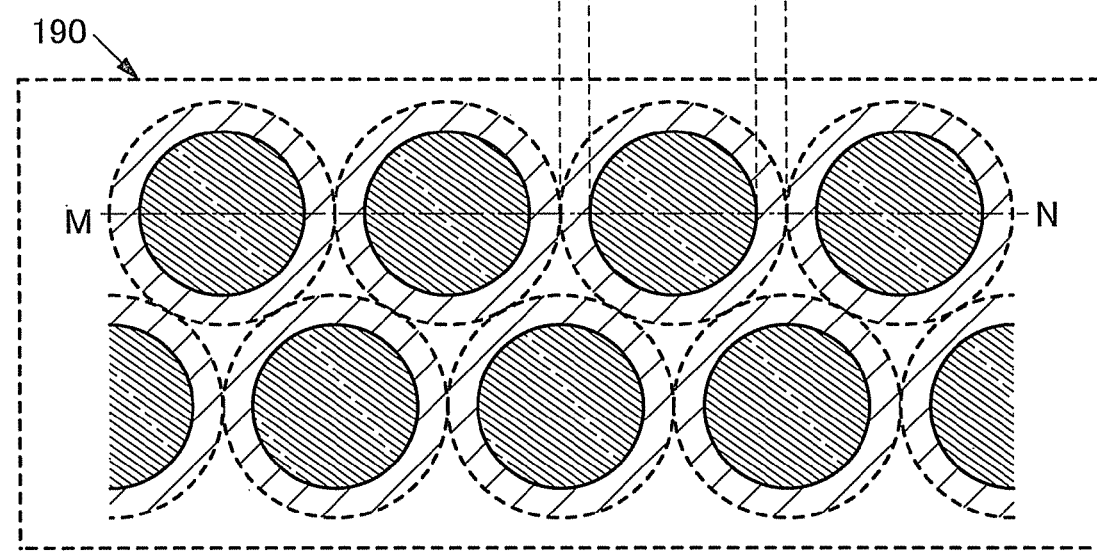

In FIGS. 1A and 1B, a structure of a solid-state light-emitting device 190 described as an example in this embodiment is illustrated. FIG. 1A is a cross-sectional view illustrating the solid-state light-emitting device 190 in which solid-state light-emitting elements 180 are arranged in matrix, and FIG. 1B is a front view observed from a light extraction surface side of the solid-state light-emitting device 190. Note that FIG. 1A corresponds to the cross-sectional view taken along line M-N in FIG. 1B.

A structure of the solid-state light-emitting element 180 is described in detail with reference to FIGS. 2A to 2D. The solid-state light-emitting element 180 includes a member 150 with a low refractive index, a bonding layer 160 with a high refractive index, and a solid-state light-emitting body 170. Further, a partition 140 is provided between the solid-state light-emitting body 170 and an adjacent solid-state light-emitting body, and the solid-state light-emitting body 170 is provided with a light-emitting region which is separated from an adjacent solid-state light-emitting body.

<Structure of Member with Low Refractive Index>

The member 150 with a low refractive index has a hemispherical structure 151 on a first surface and an uneven structure 152 on a second surface. It is preferable that the member 150 with a low refractive index transmit light emitted by the solid-state light-emitting body 170 and have a refractive index of higher than 1.0 and lower than 1.6. In particular, a material which transmits visible light and has a refractive index of higher than or equal to 1.4 and lower than 1.6 is preferably used.

There are many kinds of materials with a refractive index of higher than 1.0 and lower than 1.6, which means that such materials are easy to purchase at low cost and that the degree of freedom for selecting a material is high. Owing to the high degree of freedom for selecting a material, the degree of freedom for selecting a manufacturing method is also high, which facilitates manufacture.

The member 150 with a low refractive index may be formed using, for example, glass or a resin. As the resin, a polyester resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, a polyvinylchloride resin, or the like can be used.

The hemispherical structure 151 includes an arc in a cross section passing through a peak of the hemispherical structure 151. For example, one mode of the hemispherical structure is a structure whose base is circular and whose cross section passing through a peak of the structure is semicircular. Another mode of the hemispherical structure is a structure (which can be referred to as an umbrella-like structure) whose base is polygonal and whose cross section passing through a peak of the structure includes an arc (e.g., a semicircle). A hemispherical structure whose base is a polygon with many angles is substantially the same as a hemispherical structure whose base is circular. When the base is polygonal, adjacent hemispherical structures can be arranged without a space therebetween. For example, in the case where the base of the hemispherical structure is triangular, quadrangular, or hexagonal, the hemispherical structures can be arranged with a closest packed structure on a plane. Specifically, a hemispherical structure whose base is hexagonal is preferable because such a hemispherical structure increases light extraction efficiency.

Note that a light-emitting device may be fowled by arrangement of hemispherical structures varying in shape and size. For example, a small hemispherical structure is provided in a space between adjacent larger hemispherical structures, in which case light extraction efficiency can be increased.

In addition, some of the hemispherical structures (in this specification, a "hemispherical structure" may include a portion of a spherical structure cut by a plane) may be a flatter hemispherical structure or the like due to a slight error in design. A shape in which total reflection can be reduced as much as possible between the hemispherical structure and the air can be employed.

The uneven structure 152 may have a regular form or an irregular form. Further, the uneven structure 152 and an uneven structure of the adjacent solid-state light-emitting element 180 may be continuous or discontinuous with each other. A height from the bottom of the valley to the peak of the uneven structure 152 may be around 0.1 μm to 100 μm and a space between adjacent peaks is preferably about greater than or equal to 1 μm and less than or equal to 100 μm. Provision of the uneven structure makes it unnecessary to use an expensive material with a high refractive index in formation of the hemispherical structure, which facilitates manufacture.

As examples of a regular form which can be employed for the uneven structure 152, conical or pyramidal shapes such as a triangular pyramid, a quadrangular pyramid, and a hexagonal pyramid can be given. In particular, a triangular pyramid, a quadrangular pyramid, a hexagonal pyramid, or the like enables closest packing, which is preferable. As the uneven structures are more closely packed, a condition under which light emitted by the solid-state light-emitting body is totally reflected is less likely to be fulfilled and light extraction efficiency is increased.

Further, the uneven structure 152 may have a single-layer structure or a structure in which a plurality of layers are stacked. For example, a structure is preferable in which an inorganic material film with a refractive index of higher than 1.0 and lower than 1.6, a light-transmitting property, and a barrier property is provided at an interface with the bonding layer with a high refractive index. As the inorganic material film, a silicon oxide film or a silicon oxynitride film can be used, for example. The inorganic material film with a light-transmitting property and a barrier property can prevent diffusion of an impurity to the solid-state light-emitting body without reducing light extraction efficiency. For example, when the solid-state light-emitting body is an organic EL element, entry of an impurity such as moisture into the light-emitting body can be suppressed and the reliability of the solid-state light-emitting element can be improved.

The hemispherical structure 151 and the uneven structure 152 may be formed using a mold. Specifically, when the member 150 with a low refractive index is formed by molding the hemispherical structure 151 and the uneven structure 152 together by injection molding using the same material, a refractive index difference is less likely to be formed therebetween, so that stray light can be reduced. As a result, extraction efficiency of light emitted by the solid-state light-emitting body can be improved (see FIG. 2B).

Figure 2A:
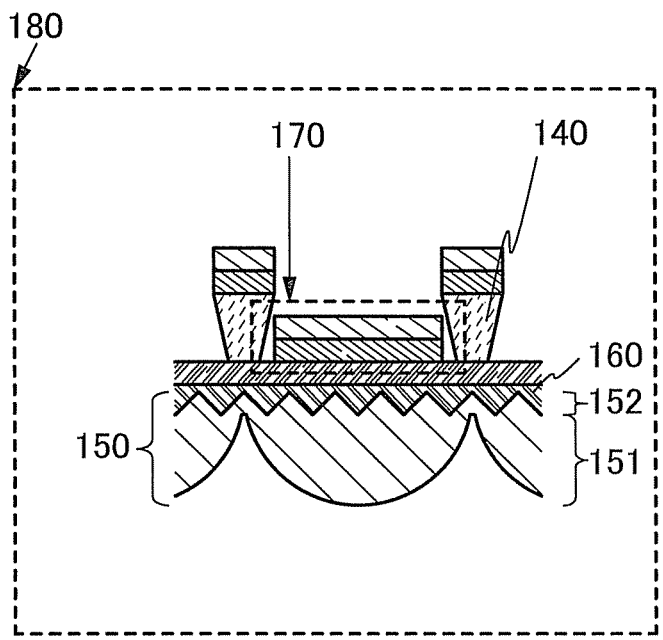
FIGS. 2A to 2D illustrate structures of a solid-state light-emitting element according to one embodiment of the present invention.
Figure 2B:
Figure 2C:
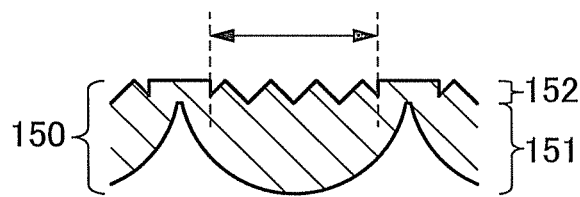

The uneven structure 152 may be formed only in a region denoted by the arrow which overlaps with the light-emitting region of the solid-state light-emitting body 170, as illustrated in FIG. 2C. With such a structure, the mechanical strength of the member 150 with a low refractive index can be increased.

As a method for forming the uneven structure 152, for example, an etching method, a sand blasting method, a microblast processing method, a droplet discharge method, a printing method (screen printing or offset printing by which a pattern is formed), a coating method such as a spin coating method, a dipping method, a dispenser method, an imprint method, a nanoimprint method, or the like can be employed as appropriate.

Figure 2D:
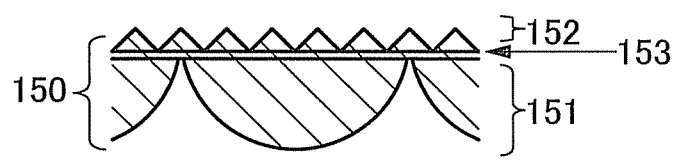

The member 150 with a low refractive index may have a structure in which a plurality of members are combined. For example, the member with a low refractive index may have a structure in which a hemispherical structure or a microlens array is attached to one surface of a support, or a structure in which a film on which an uneven structure is formed is attached to the other surface. In FIG. 2D, an example of a structure in which the hemispherical structure 151 is attached to a first surface of a support 153 and the uneven structure 152 is attached to a second surface of the support 153 is illustrated. Note that when a plurality of members are attached, it is preferable that the members and an adhesive be made to have substantially the same refractive index (a difference in refractive indices be 0.15 or lower), in which case a refractive index difference inside the member 150 with a low refractive index can be suppressed. As a result, stray light can be reduced and extraction efficiency of light emitted by the solid-state light-emitting body can be improved.

<Structure of Bonding Layer with a High Refractive Index>

One surface of the bonding layer 160 with a high refractive index is in contact with the uneven structure 152 of the member 150 with a low refractive index and the other surface of the bonding layer 160 is flat.

For the bonding layer 160 with a high refractive index, a material which transmits light emitted by the solid-state light-emitting body 170 and has a refractive index of 1.6 or higher is preferably used, and a material with a refractive index of higher than or equal to 1.7 and lower than or equal to 2.1 is particularly preferable. When the refractive index of the material is higher than 1.6, the refractive index is almost the same as or higher than that of the solid-state light-emitting body. Therefore, even when the bonding layer 160 is in contact with the solid-state light-emitting body through the flat surface, a condition under which light is totally reflected is less likely to be fulfilled and waveguide light is less likely to be generated, which is preferable. At the same time, the degree of freedom for selecting the material with a refractive index of higher than 1.6 is limited and such a material is relatively expensive.

However, the thickness of the bonding layer 160 with a high refractive index which is described as an example in this embodiment may be set such that the uneven structure 152 of the member 150 with a low refractive index is filled and a flat surface is formed. Thus, the use amount of an expensive material with a refractive index of 1.6 or higher can be reduced, and the bonding layer 160 can be fanned easily.

Further, the bonding layer 160 with a high refractive index fills depressed portions of the uneven structure 152 of the member 150 with a low refractive index and forms the flat surface. Accordingly, non-uniformity in film thickness, defective coverage, or the like which results from the unevenness is less likely to be caused, and the solid-state light-emitting body 170 can be easily formed.

The bonding layer 160 with a high refractive index is formed using glass or a resin with a high refractive index. As examples of a resin with a high refractive index, a resin containing bromine, a resin containing sulfur, and the like are given. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used.

The bonding layer 160 with a high refractive index may have a single-layer structure or a structure in which a plurality of layers are stacked. For example, a structure including an inorganic material film (specifically a nitride film) with a refractive index of 1.6 or higher is preferably employed. Examples of such a film include a silicon nitride film, an aluminum nitride film, a silicon nitride oxide film, an aluminum oxide film, and the like. A nitride film can prevent diffusion of an impurity to the solid-state light-emitting body without reducing light extraction efficiency. For example, when the solid-state light-emitting body is an organic EL element, entry of an impurity such as moisture into the light-emitting body can be suppressed and the reliability of the solid-state light-emitting element can be improved.

A method for forming the bonding layer 160 with a high refractive index may be appropriately selected from a variety of methods suitable for the material in consideration of the adhesion strength, ease of processing, or the like. It is possible that any of the above-described resins is deposited by, for example, a spin coating method or a screen printing method and is cured with heat or light.

<Structure of Solid-State Light-Emitting Body>

The solid-state light-emitting body 170 includes a light-emitting layer with a refractive index of 1.6 or higher. As examples of the solid-state light-emitting body 170, an organic EL element, an inorganic EL element, and an LED can be given.

<Structure of Solid-State Light-Emitting Element>

Although high reliability of a solid-state light-emitting body can be expected, a structure for efficiently extracting light to the air is needed because light is generated in a region with a refractive index higher than that of the air. This is because, when light proceeds from a region with a high refractive index to a region with a low refractive index, there is a condition under which light cannot be extracted to the region with a low refractive index due to total reflection on an interface between the regions.

The solid-state light-emitting element described as an example in this embodiment includes the member with a low refractive index which has the hemispherical structure on the first surface and the uneven structure on the second surface, the bonding layer with a high refractive index which planarizes the uneven structure, and the light-emitting body whose light-emitting surface is in contact with the flat surface of the bonding layer with a high refractive index. The uneven structure of the member with a low refractive index is provided inside at least the outside shape of the hemispherical structure formed on the first surface. The light-emitting body is provided such that the outside shape of the light-emitting region of the light-emitting body is smaller than the outside shape of the hemispherical structure and overlaps with the hemispherical structure (see FIG. 3B). A reason why light can be efficiently extracted from the solid-state light-emitting body with a high refractive index to the air with a low refractive index owing to the above structure will be described below with reference to FIGS. 3A and 3B.

Figure 10A:
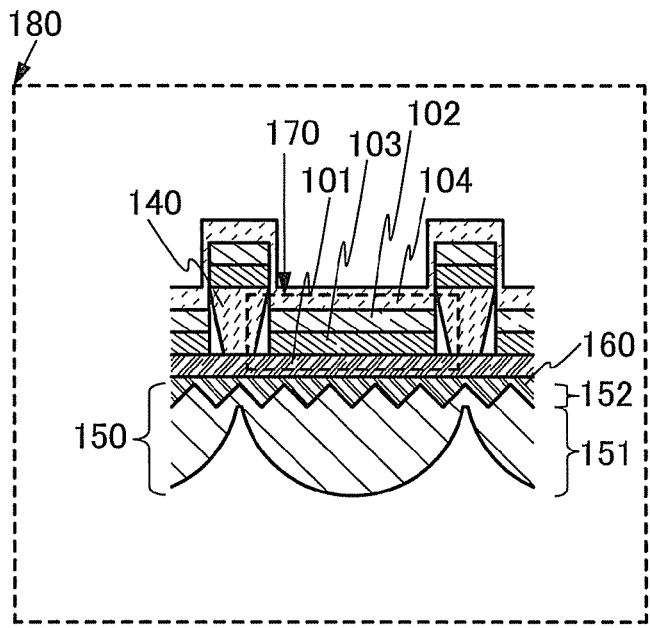
FIGS. 10A and 10B illustrate structures of a solid-state light-emitting body according to one embodiment of the present invention.

In this embodiment, the case where an organic EL element is used for the solid-state light-emitting body 170 of the solid-state light-emitting element 180 is described. Specifically, the solid-state light-emitting body 170 has a structure in which a layer 103 containing a light-emitting organic compound is interposed between a first electrode 101 and a second electrode 102. The first electrode 101 transmits light emitted by the layer 103 containing a light-emitting organic compound, which is reflected by the second electrode 102. Further, the partition 140 is formed perpendicularly to a surface of the first electrode 101 or reverse tapered, and separates the solid-state light-emitting body 170 from an adjacent solid-state light-emitting body (see FIG. 3A). Note that the first electrode 101 and the second electrode 102 are connected to a power source through respective wirings which are not shown. For example, when a conductive film 104 is formed to overlap with the second electrode 102 by a film formation method (e.g., sputtering) which allows favorable coverage, the second electrode 102 of the solid-state light-emitting body 170 can be connected to a second electrode of an adjacent solid-state light-emitting body (see FIG. 10A). A similar effect can be obtained also when the second electrode 102 is found by a film formation method which allows favorable coverage.

Figure 3A:
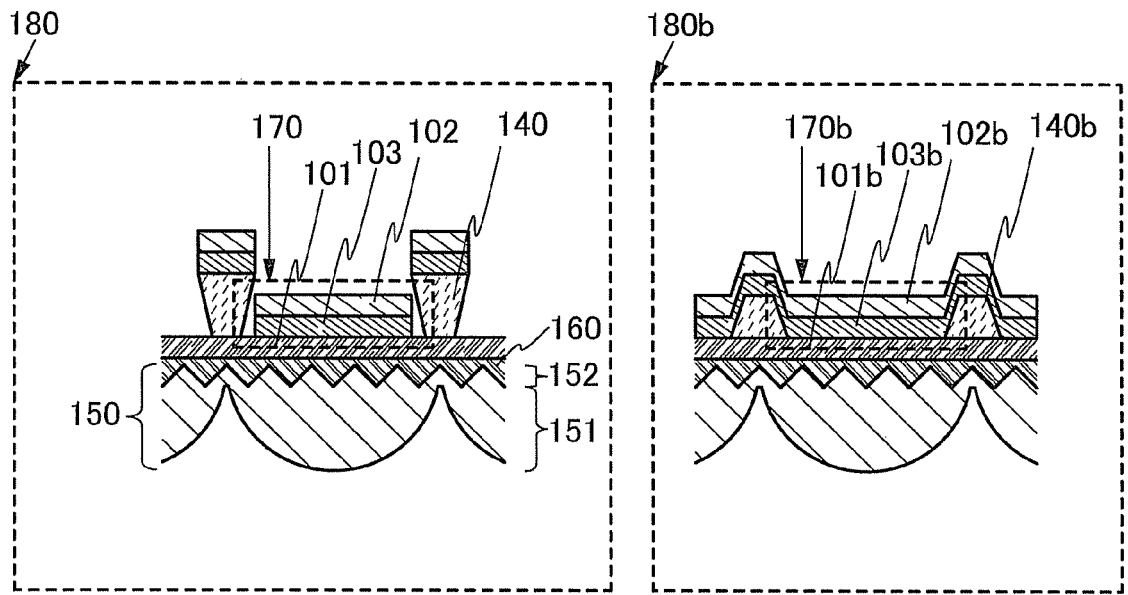
FIGS. 3A and 3B illustrate structures of a solid-state light-emitting element according to one embodiment of the present invention.

A modification example of the partition is illustrated in the right part of FIG. 3A. A solid-state light-emitting element 180b is provided with a forward tapered partition 140b. The partition 140b electrically insulates a first electrode 101b from a layer 103b containing a light-emitting organic compound, and separates a solid-state light-emitting body 170b from an adjacent solid-state light-emitting body. Further, the forward tapered partition 140b is employed, so that a second electrode 102b of the solid-state light-emitting body 170b can be connected to a second electrode of an adjacent solid-state light-emitting body. Note that the first electrode 101b of the solid-state light-emitting body 170b which is illustrated as an example in FIG. 3A is connected to a first electrode of an adjacent solid-state light-emitting body. Therefore, it can be said that the solid-state light-emitting body 170b and an adjacent light-emitting body are connected in parallel.

Note that the uneven structure 152 of the member 150 with a low refractive index is planarized by the bonding layer 160 with a high refractive index. By forming the first electrode 101 over a surface planarized by the bonding layer 160 with a high refractive index, the first electrode 101 is formed flat, so that a short circuit between the first electrode 101 and the second electrode 102 can be prevented. Thus, such a structure brings about an effect of improving the reliability of the solid-state light-emitting body 170.

In the solid-state light-emitting body 170, the layer 103 containing a light-emitting organic compound emits light by application of voltage higher than or equal to a threshold value on the first electrode 101 and the second electrode 102. Then, the light is transmitted through the first electrode 101 which transmits light emitted by the light-emitting organic compound and proceeds to an interface with the bonding layer 160 with a high refractive index. Note that in this specification, a region where light emission by the solid-state light-emitting body occurs is called a light-emitting region. Further, a surface where light is emitted from the solid-state light-emitting body to the bonding layer with a high refractive index is called a light-emitting surface.

Figure 3B:
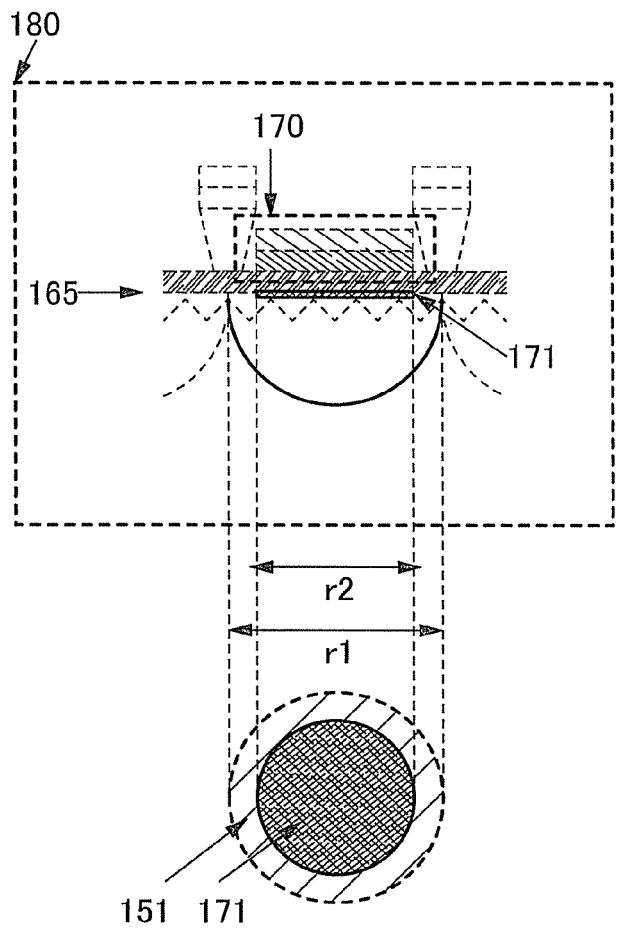

Accordingly, in FIG. 3B, an interface at which the first electrode 101 which transmits light emitted by the solid-state light-emitting body 170 is in contact with the bonding layer 160 with a high refractive index is a light-emitting surface. Further, a shape which is obtained by projecting the light-emitting region of the solid-state light-emitting body 170 on a surface 165 including the light-emitting surface is an outside shape 171 of the light-emitting region.

Similarly to the solid-state light-emitting body 170, the bonding layer 160 with a high refractive index has a refractive index which is higher than that of the air; therefore, total reflection of much of light emitted by the solid-state light-emitting body 170 is not caused at the interface with the bonding layer 160 with a high refractive index and much of the light can enter the bonding layer 160 with a high refractive index.

The light which enters the bonding layer 160 with a high refractive index proceeds to the uneven structure 152 of the member 150 with a low refractive index. Since the uneven structure 152 has an angle which is not parallel to the light-emitting surface, total reflection is less likely to be repeated at an interface between the uneven structure 152 and the bonding layer 160 with a high refractive index. As a result, light emitted by the solid-state light-emitting body 170 can enter the inside of the member 150 with a low refractive index highly efficiently.

As illustrated in FIG. 3B, the member with a low refractive index of n has the hemispherical structure which is in contact with the air whose refractive index is further lower. Further, a diameter r2 of the outside shape 171 of the light-emitting region of the solid-state light-emitting body 170 is smaller than a diameter r1 of an outside shape of the hemispherical structure 151 which is projected on the surface 165 including the light-emitting surface. In addition, the light-emitting body is provided such that the outside shape of the light-emitting region overlaps with the hemispherical structure 151. Thus, light emitted from the light-emitting body is extracted through the hemispherical structure to the outside.

Especially when the outside shape 171 of the light-emitting region and the outside shape of the hemispherical structure 151 which is projected on the surface 165 including the light-emitting surface are similar in shape and the outside shape 171 is included in a range (1/n) times as large as the outside shape of the hemispherical structure 151, i.e., r2 is (1/n) times as large as r1, total reflection of light is suppressed as much as possible, and light emitted from the light-emitting body can be efficiently extracted through the hemispherical structure to the air. Light which enters a region close to a peripheral portion of the hemispherical structure 151 is repeatedly totally reflected and hard to be extracted. Therefore, by providing the light-emitting region in a region other than that region, a reduction in extraction efficiency can be prevented.

Modification Example

Figure 4A:
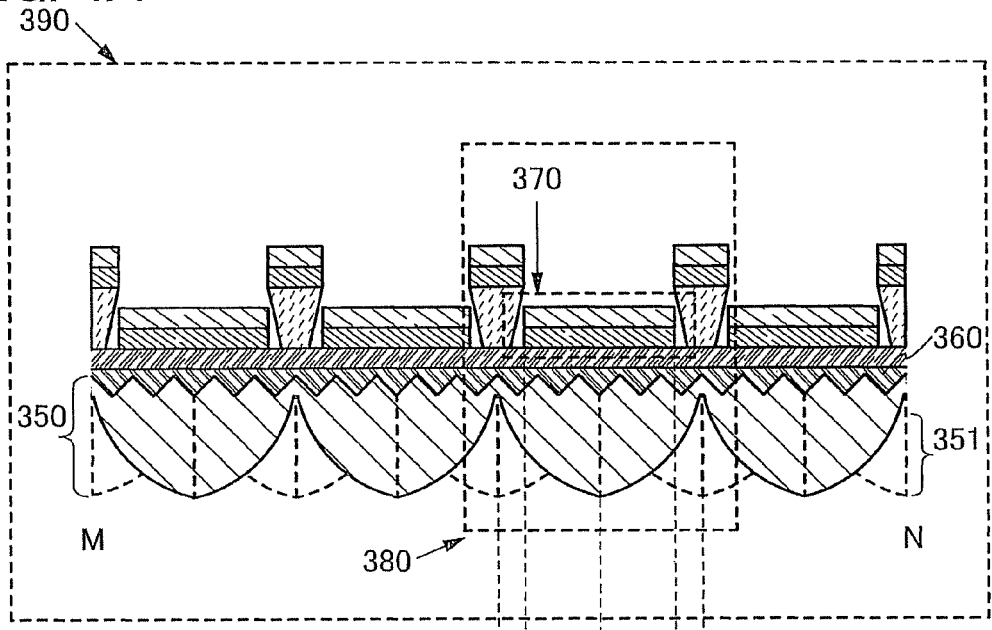
FIGS. 4A to 4C illustrate a structure of a solid-state light-emitting device according to one embodiment of the present invention.
Figure 4B:
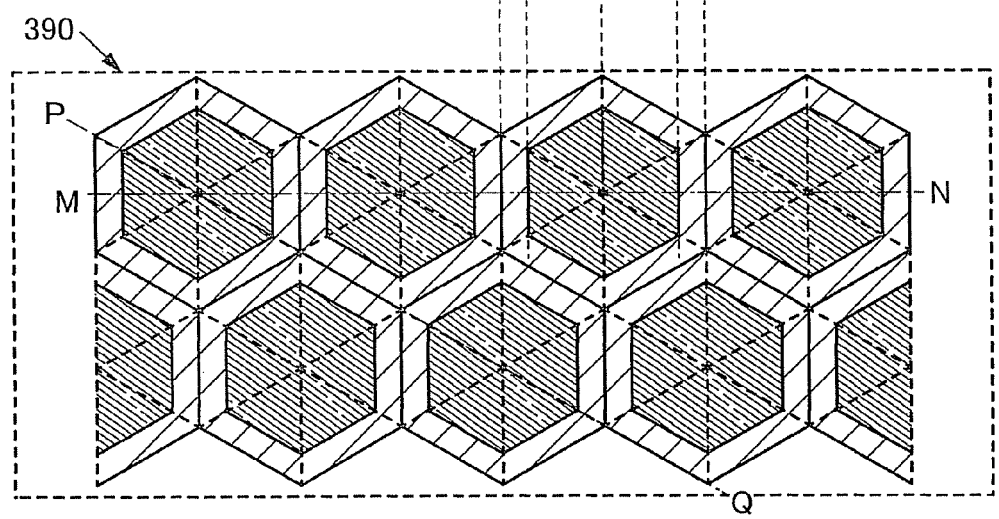
Figure 4C:
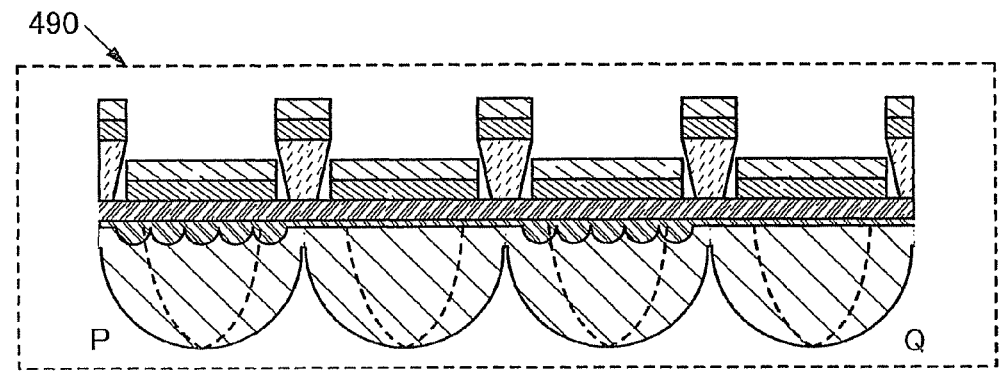

In FIGS. 4A to 4C, a modification example of this embodiment is illustrated. A solid-state light-emitting device 390 illustrated as an example in FIGS. 4A to 4C has the same structure as the solid-state light-emitting device 190 illustrated as an example in FIGS. 1A and 1B except that the solid-state light-emitting device 390 is provided with a hexagonal light-emitting surface and a hemispherical structure whose base is hexagonal.

FIG. 4A is a cross-sectional view illustrating the solid-state light-emitting device 390 in which solid-state light-emitting elements 380 are arranged in matrix, and FIG. 4B is a front view observed from a light extraction surface side of the solid-state light-emitting device 390. Note that FIG. 4A corresponds to the cross-sectional view taken along line M-N in FIG. 4B and FIG. 4C corresponds to the cross-sectional view taken along line P-Q in FIG. 4B.

The solid-state light-emitting element 380 includes a solid-state light-emitting body 370 provided with a hexagonal light-emitting region, a bonding layer 360 with a high refractive index, and a member 350 with a low refractive index which has an uneven structure on a first surface and a hemispherical structure on a second surface. An outside shape of a light-emitting region which is obtained by projecting the light-emitting region of the solid-state light-emitting body 370 on the surface including the light-emitting surface, and an outside shape of a hemispherical structure 351 (which can also be seen as an outside shape of the base of the hemispherical structure) form concentric hexagons. Further, in the member 350 with a low refractive index of n, the outside shape of the light-emitting region of the solid-state light-emitting body 370 is included in a range (1/n) times as large as the outside shape of the hemispherical structure 351.

The hemispherical structure 351 has a ridge line from an edge of its base to its peak. In a cross section passing through the ridge line, the ridge line includes an arc. Note that the hemispherical structure 351 can also be referred to as an umbrella-like hemispherical structure. Note that the solid-state light-emitting body 370 of the solid-state light-emitting element 380 which is described as an example in this modification example has a structure similar to that of the solid-state light-emitting body 170 of the above-described solid-state light-emitting element 180. Specifically, a light-emitting organic compound is interposed between a first electrode and a second electrode. Further, the first electrode and the second electrode of the solid-state light-emitting body 370 are connected to a power source through respective wirings which are not shown. For example, when a conductive film is formed to overlap with the second electrode by a film formation method (e.g., sputtering) which allows favorable coverage, the second electrode of the solid-state light-emitting body 370 can be connected to a second electrode of an adjacent solid-state light-emitting body. A similar effect can be obtained also when the second electrode is formed by a film formation method which allows favorable coverage.

The solid-state light-emitting device described as an example in this modification example includes a plurality of hemispherical structures on one surface, and the outside shape of the hemispherical structure is in contact with an outside shape of an adjacent hemispherical structure without a space. Further, the outside shape of the light-emitting region of the solid-state light-emitting body is included in a range (1/n) times as large as the outside shape of the hemispherical structure. With such a structure, when a certain area is assumed, the solid-state light-emitting elements can be arranged with higher density, so that the solid-state light-emitting device can be reduced in size.

Specifically, the light-emitting region of the solid-state light-emitting body is provided to be (1/n) times as large as the outside shape of the hemispherical structure, in a region other than a peripheral portion of the hemispherical structure, in which light is less likely to be extracted; as a result, the area occupied by the solid-state light-emitting device can be minimized without reducing light extraction efficiency. Moreover, light extraction efficiency of the solid-state light-emitting device can be maximized.

The solid-state light-emitting element which is described as an example in this embodiment includes the member with a low refractive index which has the hemispherical structure on the first surface and the uneven structure on the second surface, the bonding layer with a high refractive index which planarizes the uneven structure, and the light-emitting body whose light-emitting surface is in contact with a flat surface of the bonding layer with a high refractive index. The uneven structure of the member with a low refractive index is provided inside at least the outside shape of the hemispherical structure formed on the first surface. The light-emitting body is provided such that the outside shape of the light-emitting region of the light-emitting body is smaller than the outside shape of the hemispherical structure and overlaps with the hemispherical structure. In the solid-state light-emitting element, the use amount of a material with a high refractive index can be small; accordingly, a solid-state light-emitting element with high light extraction efficiency can be provided with the use of an inexpensive material.

Further, a light-emitting device in which the solid-state light-emitting elements are arrayed is formed to include a solid-state light-emitting element with high light extraction efficiency which is formed using an inexpensive material; thus, the light-emitting device has high light extraction efficiency and is inexpensive.

This embodiment can be combined as appropriate with any of the other embodiments in this specification.

Embodiment 2

In this embodiment, a solid-state light-emitting element in a mode different from that in Embodiment 1 and a light-emitting device in which the solid-state light-emitting elements are arrayed are described with reference to FIGS. 5A and 5B and FIG. 6. The solid-state light-emitting element described as an example in this embodiment includes a member with a low refractive index which has a hemispherical structure on a first surface and a hemispherical depression structure on a second surface, a bonding layer with a high refractive index which planarizes the hemispherical depression structure, and a light-emitting body whose light-emitting surface is in contact with a flat surface of the bonding layer with a high refractive index. Further, the hemispherical depression structure of the member with a low refractive index is provided inside an outside shape of the hemispherical structure formed on the first surface. Further, the light-emitting body includes a plurality of subordinate solid-state light-emitting bodies. The subordinate solid-state light-emitting body is provided such that an outside shape of a light-emitting region of the subordinate solid-state light-emitting body is smaller than an outside shape of the hemispherical depression structure and overlaps with the outside shape of the hemispherical depression structure (see FIG. 6).

Figure 5A:
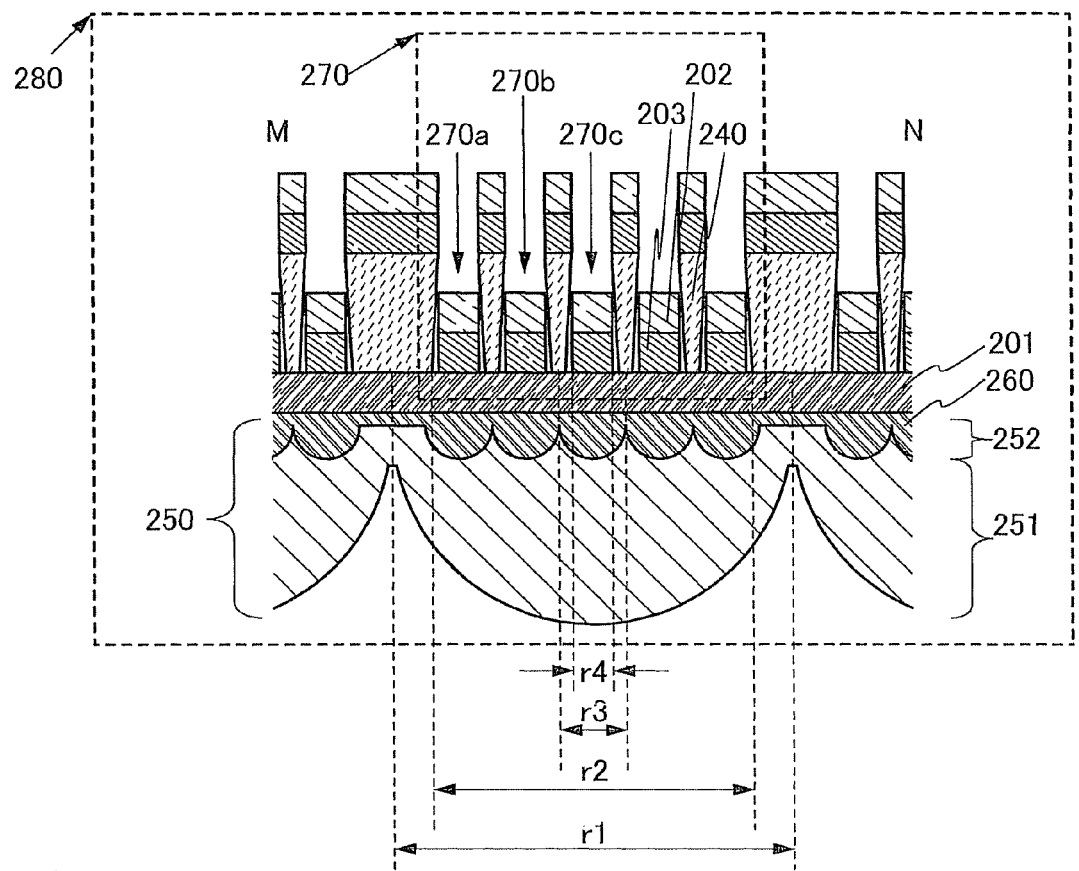
FIGS. 5A and 5B illustrate a structure of a solid-state light-emitting device according to one embodiment of the present invention.
Figure 5B:
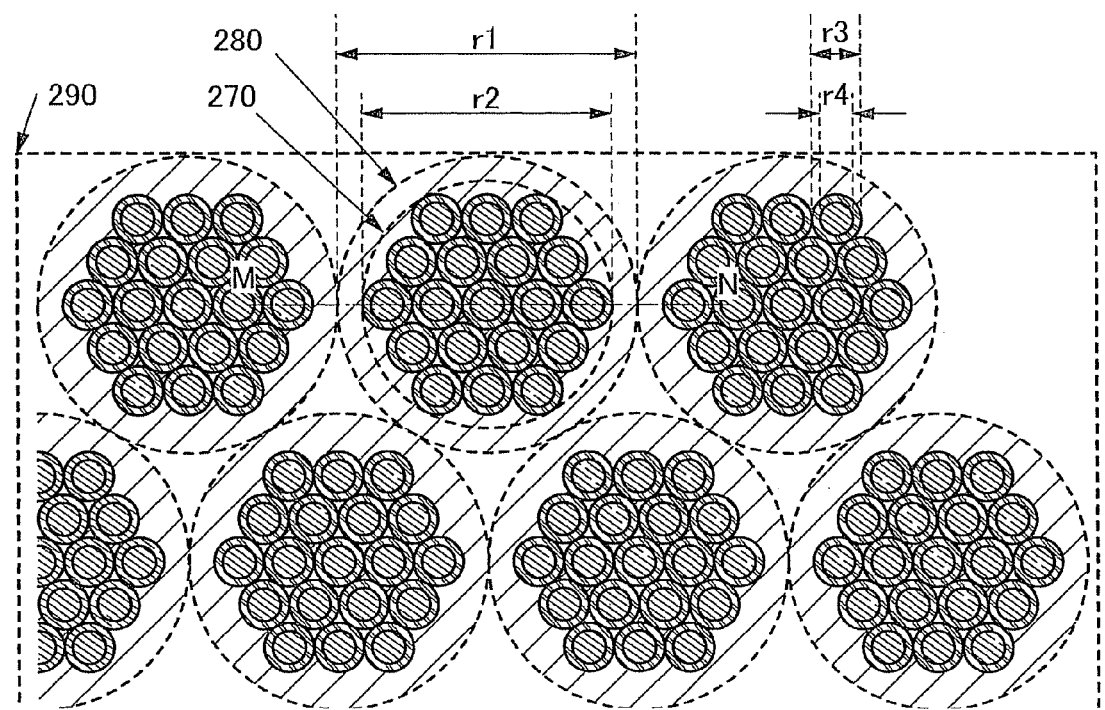

Structures of a solid-state light-emitting device 290 and a solid-state light-emitting element 280 which are described as examples in this embodiment are illustrated in FIGS. 5A and 5B. FIG. 5A is a cross-sectional view of the solid-state light-emitting element 280 in which a plurality of subordinate solid-state light-emitting bodies are arranged, and FIG. 5B is a front view observed from a light extraction surface side of the solid-state light-emitting device 290 in which the solid-state light-emitting elements 280 are arrayed. Note that FIG. 5A corresponds to the cross-sectional view taken along line M-N in FIG. 5B.

A structure of the solid-state light-emitting element 280 is described in detail with reference to FIG. 5A. The solid-state light-emitting element 280 includes a member 250 with a low refractive index, a bonding layer 260 with a high refractive index, and a solid-state light-emitting body 270.

The solid-state light-emitting body 270 includes, as illustrated in FIG. 5A, a plurality of subordinate solid-state light-emitting bodies including small subordinate solid-state light-emitting bodies 270a, 270b, and 270c. A partition 240 is provided between the subordinate solid-state light-emitting bodies and separates light-emitting regions thereof.

<Structure of Member with Low Refractive Index>

The member 250 with a low refractive index can be formed using a material and a method which are similar to those of the member 150 with a low refractive index described as an example in Embodiment 1, except that the member 250 with a low refractive index is formed to have a hemispherical structure 251 on a first surface and a hemispherical depression structure 252 on a second surface. Specifically, the member 250 with a low refractive index may be formed using a material which transmits light emitted by the solid-state light-emitting body 270 and has a refractive index of higher than 1.0 and lower than 1.6, by injection molding or the like, for example. For the details, Embodiment 1 can be referred to.

The diameter of a hemispherical depression provided on the hemispherical depression structure 252 may be approximately greater than or equal to 1 μm and less than or equal to 100 μm, and it is preferable that the hemispherical depressions be arranged in a closest-packed arrangement. As the hemispherical depressions are more closely packed, an area occupied by the light-emitting region of the subordinate solid-state light-emitting body per unit area can be increased, whereby the solid-state light-emitting element 280 can further brighten.

<Structure of Bonding Layer with High Refractive Index>

One surface of the bonding layer 260 with a high refractive index is in contact with the hemispherical depression structure 252 of the member 250 with a low refractive index, and the other surface of the bonding layer 260 with a high refractive index is flat. The bonding layer 260 with a high refractive index can be formed using a material and a method which are similar to those of the bonding layer 160 with a high refractive index described as an example in Embodiment 1. Specifically, the bonding layer 260 with a high refractive index may be fowled using a material which transmits light emitted by the solid-state light-emitting body 270 and has a refractive index of 1.6 or higher by a spin coating method, a screen printing method, or the like, in such a manner that the hemispherical depression structure 252 is filled and a flat surface is formed. For the details, Embodiment 1 can be referred to.

<Structure of Solid-State Light-Emitting Body>

The solid-state light-emitting body 270 includes a light-emitting layer with a refractive index of 1.6 or higher. As examples of the solid-state light-emitting body 270, an organic EL element, an inorganic EL element, and an LED can be given.

<Structure of Solid-State Light-Emitting Element>

Although high reliability of a solid-state light-emitting body can be expected, a structure for efficiently extracting light to the air is needed because light is generated in a region with a refractive index higher than that of the air. This is because, when light proceeds from a region with a high refractive index to a region with a low refractive index, there is a condition under which light cannot be extracted to the region with a low refractive index due to total reflection on an interface between the regions.

The solid-state light-emitting element described as an example in this embodiment includes the member with a low refractive index which has a hemispherical structure on the first surface and the hemispherical depression structure on the second surface, the bonding layer with a high refractive index which planarizes the hemispherical depression structure, and the light-emitting body whose light-emitting surface is in contact with a flat surface of the bonding layer with a high refractive index. The hemispherical depression structure of the member with a low refractive index is provided inside the outside shape of the hemispherical structure formed on the first surface. The light-emitting body includes a plurality of the subordinate solid-state light-emitting bodies. The subordinate solid-state light-emitting body is provided such that the outside shape of the light-emitting region of the subordinate solid-state light-emitting body is smaller than the outside shape of the hemispherical depression structure and overlaps with the outside shape of the hemispherical depression structure. A reason why light can be efficiently extracted from the solid-state light-emitting body with a high refractive index to the air with a low refractive index owing to the above structure will be described below.

In this embodiment, the case where an organic EL element is used for the solid-state light-emitting body 270 of the solid-state light-emitting element 280 is described. Specifically, each of the plurality of subordinate solid-state light-emitting bodies included in the solid-state light-emitting body 270 has a structure in which a layer 203 containing a light-emitting organic compound is interposed between a first electrode 201 and a second electrode 202. The first electrode 201 transmits light emitted by the layer 203 containing a light-emitting organic compound, which is reflected by the second electrode 202. Further, the partition 240 is reverse tapered and separates the light-emitting regions of the subordinate solid-state light-emitting bodies (see FIG. 5A).

Note that the hemispherical depression structure 252 of the member 250 with a low refractive index is planarized by the bonding layer 260 with a high refractive index. By forming the first electrode 201 over a surface planarized by the bonding layer 260 with a high refractive index, the first electrode 201 is fowled flat, so that a short circuit between the first electrode 201 and the second electrode 202 can be prevented. Thus, such a structure brings about an effect of improving the reliability of the solid-state light-emitting body 270.

In the solid-state light-emitting body 270, the layer 203 containing a light-emitting organic compound emits light by application of voltage higher than or equal to a threshold value on the first electrode 201 and the second electrode 202. Then, the light is transmitted through the first electrode 201 which transmits light emitted by the light-emitting organic compound and proceeds to an interface with the bonding layer 260 with a high refractive index.

Figure 6:
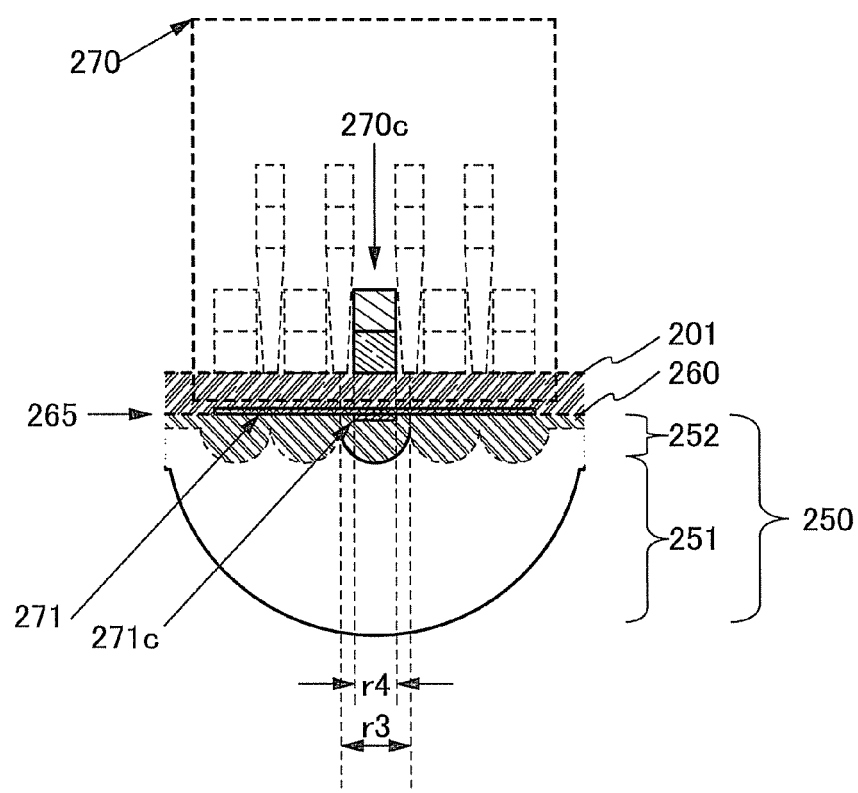
FIG. 6 illustrates a structure of a solid-state light-emitting element according to one embodiment of the present invention.

Note that, in FIG. 6, an interface at which the first electrode 201 which transmits light emitted by the solid-state light-emitting body 270 is in contact with the bonding layer 260 with a high refractive index is a light-emitting surface. Note also that a shape which is obtained by projecting the light-emitting region of the subordinate solid-state light-emitting body 270c on a surface 265 including the light-emitting surface is an outside shape 271c of a subordinate light-emitting region; a shape which is obtained by projecting a light-emitting region of the solid-state light-emitting body 270 on the surface 265 including the light-emitting surface is an outside shape 271 of the light-emitting region. Further, although description is made with the subordinate solid-state light-emitting body 270c as an example in this embodiment, a similar description can be also applied to another subordinate solid-state light-emitting body of the solid-state light-emitting body 270.

Similarly to the subordinate solid-state light-emitting body 270c, the bonding layer 260 with a high refractive index has a refractive index which is higher than that of the air; therefore, total reflection of much of light emitted by the subordinate solid-state light-emitting body 270c is not caused at an interface with the bonding layer 260 with a high refractive index and much of the light can enter the bonding layer 260 with a high refractive index.

The light which enters the bonding layer 260 with a high refractive index proceeds to the hemispherical depression structure 252 of the member 250 with a low refractive index. Since the hemispherical depression structure 252 has various angles which are not parallel to the light-emitting surface, total reflection is less likely to be repeated at an interface between the hemispherical depression structure 252 and the bonding layer 260 with a high refractive index. Further, the outside shape 271c of the light-emitting region of the subordinate solid-state light-emitting body 270c which is projected on the surface 265 including the light-emitting surface has a diameter r4 which is smaller than a diameter r3 of an outside shape of the hemispherical depression structure 252. Furthermore, the subordinate solid-state light-emitting body 270c is provided such that the diameter r4 of the outside shape 271c of the light-emitting region overlaps with the hemispherical depression structure 252. As a result, light emitted by the subordinate solid-state light-emitting body 270c efficiently enters the inside of the hemispherical depression structure 252 filled with the bonding layer 260 with a high refractive index, and further enters the member 250 with a low refractive index through the hemispherical depression structure 252.

Note that, similarly to light emitted by the subordinate solid-state light-emitting body 270c, light emitted by another subordinate solid-state light-emitting body of the solid-state light-emitting body 270 also efficiently enters the member 250 with a low refractive index through the hemispherical depression structure 252.

The member 250 with a low refractive index of n, with which the solid-state light-emitting element 280 is provided, has the hemispherical structure 251 which is in contact with the air whose refractive index is further lower (see FIG. 5A). Further, the diameter r2 of the outside shape 271 of the light-emitting region of the solid-state light-emitting body 270 is smaller than the diameter r1 of the outside shape of the hemispherical structure 251 which is projected on the surface 265 including the light-emitting surface. In addition, the solid-state light-emitting body 270 is provided such that the outside shape of the light-emitting region overlaps with the hemispherical structure 251. Thus, light emitted from the light-emitting body is extracted through the hemispherical structure 251 to the outside.

Especially when the outside shape 271 of the light-emitting region and the outside shape of the hemispherical structure 251 which is projected on the surface 265 including the light-emitting surface are similar in shape and the outside shape 271 is included in a range (1/n) times as large as the outside shape of the hemispherical structure 251, i.e., r2 is (1/n) times as large as r1, total reflection of light is suppressed as much as possible, and light emitted from the light-emitting body can be efficiently extracted through the hemispherical structure to the air. Light which enters a region close to a peripheral portion of the hemispherical structure 251 is repeatedly totally reflected and hard to be extracted. Therefore, by providing the light-emitting region in a region other than that region, a reduction in extraction efficiency can be prevented.

Figure 10B:
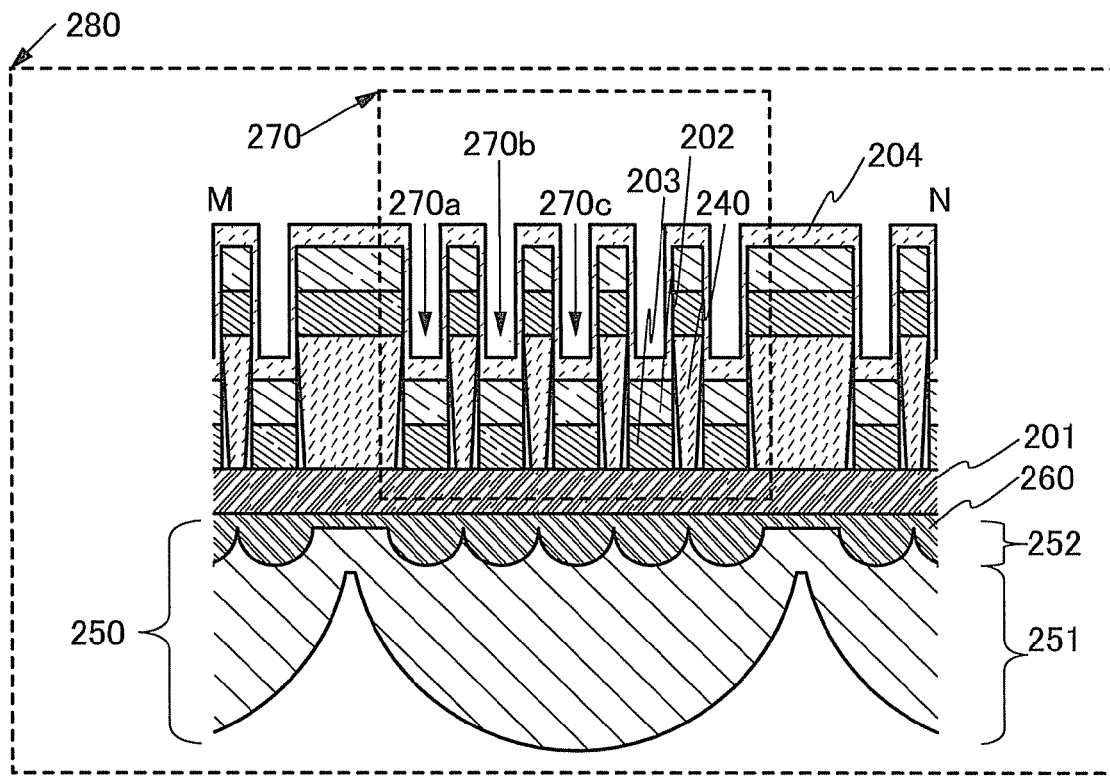

Note that the subordinate solid-state light-emitting body of the subordinate solid-state light-emitting element which is described as an example in this embodiment has a structure similar to that of the solid-state light-emitting body 170 of the solid-state light-emitting element 180 in Embodiment 1. Specifically, the light-emitting organic compound is interposed between the first electrode and the second electrode. Further, the first electrode and the second electrode of the subordinate solid-state light-emitting body are connected to a power source through respective wirings which are not shown. For example, when a conductive film 204 is formed to overlap with the second electrode by a film formation method (e.g., sputtering) which allows favorable coverage, the second electrode of the subordinate solid-state light-emitting body can be connected to a second electrode of an adjacent subordinate solid-state light-emitting body (see FIG. 10B). Further, a similar effect can be obtained also when the second electrode is formed by a film formation method which allows favorable coverage.

Modification Example

Figure 7A:
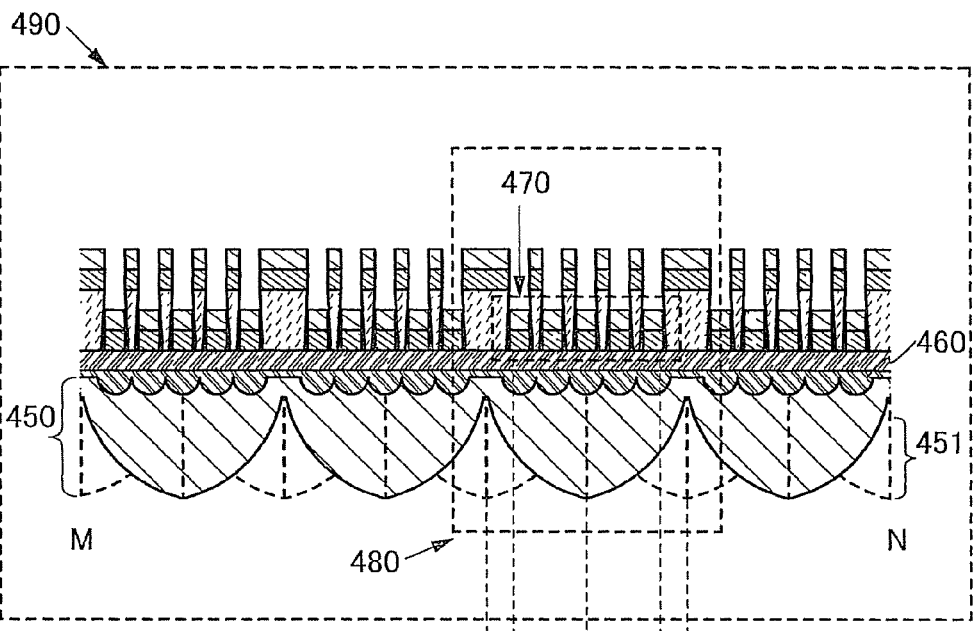
FIGS. 7A to 7C illustrate a structure of a solid-state light-emitting device according to one embodiment of the present invention.
Figure 7B:
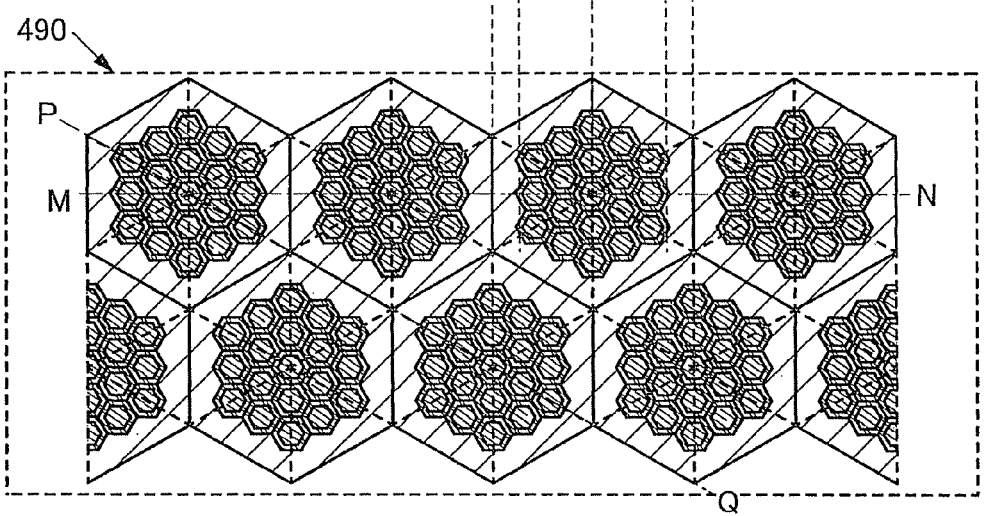
Figure 7C:
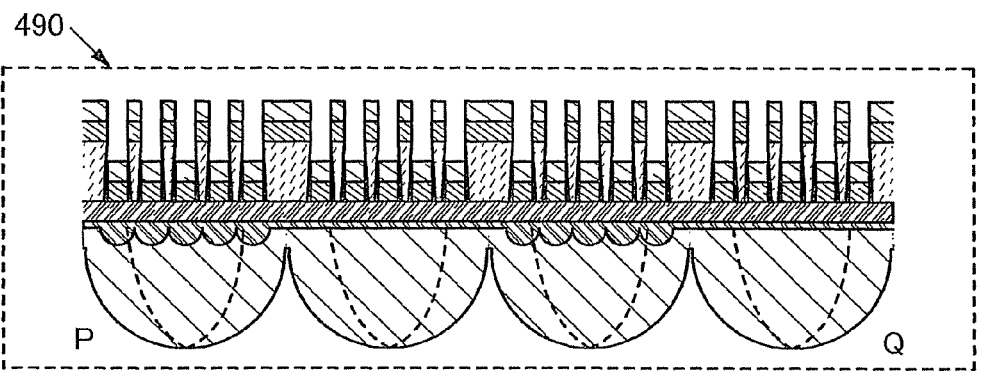

In FIGS. 7A to 7C, a modification example of this embodiment is illustrated. A solid-state light-emitting device 490 illustrated as an example in FIGS. 7A to 7C has the same structure as the solid-state light-emitting device 290 illustrated as an example in FIGS. 5A and 5B except that the solid-state light-emitting device 490 is provided with a hexagonal light-emitting surface and a hemispherical structure whose base is hexagonal.

FIG. 7A is a cross-sectional view illustrating the solid-state light-emitting device 490 in which solid-state light-emitting elements 480 are arranged in matrix, and FIG. 7B is a front view observed from a light extraction surface side of the solid-state light-emitting device 490. Note that FIG. 7A corresponds to the cross-sectional view taken along line M-N in FIG. 7B and FIG. 7C corresponds to the cross-sectional view taken along line P-Q in FIG. 7B.

The solid-state light-emitting element 480 includes a solid-state light-emitting body 470 in which subordinate-solid-state light-emitting bodies are arranged hexagonally, a bonding layer 460 with a high refractive index, and a member 450 with a low refractive index which has a hemispherical depression structure on a first surface and a hemispherical structure on a second surface. An outside shape of a light-emitting region which is obtained by projecting the light-emitting regions of the subordinate-solid-state light-emitting bodies arranged hexagonally, on a surface including the light-emitting surface, and an outside shape of a hemispherical structure 451 (which can also be seen as an outside shape of the base) form concentric hexagons. Further, in the member 450 with a low refractive index of n, the outside shape of the light-emitting region of the solid-state light-emitting body 470 is included in a range (1/n) times as large as the outside shape of the hemispherical structure 451.

The hemispherical structure 451 has a ridge line from an edge of its base to its peak. In a cross section passing through the ridge line, the ridge line includes an arc.

The solid-state light-emitting device described as an example in this modification example includes a plurality of hemispherical structures on one surface, and the outside shape of the hemispherical structure is in contact with an outside shape of an adjacent hemispherical structure without a space. Further, the outside shape of the light-emitting region of the solid-state light-emitting body is included in a range (1/n) times as large as the outside shape of the hemispherical structure. With such a structure, when a certain area is assumed, the solid-state light-emitting elements can be arranged with higher density, so that the solid-state light-emitting device can be reduced in size.

Specifically, the outside shape of the light-emitting region of the solid-state light-emitting body is provided to be (1/n) times as large as the outside shape of the hemispherical structure, in a region other than a region of a peripheral portion of the hemispherical structure, in which light is less likely to be extracted; as a result, the area occupied by the solid-state light-emitting device can be minimized. Moreover, light extraction efficiency of the solid-state light-emitting device can be maximized.

Further, a light-emitting device in which the solid-state light-emitting elements are arrayed is formed to include a solid-state light-emitting element with high light extraction efficiency which is formed using an inexpensive material; thus, the light-emitting device has high light extraction efficiency and is inexpensive.

This embodiment can be combined as appropriate with any of the other embodiments in this specification.

Embodiment 3

In this embodiment, examples of a structure and a manufacturing method of a light-emitting body that can be applied to the solid-state light-emitting element described in Embodiment 1 or 2 will be described with reference to FIGS. 8A to 8C.

The light-emitting body described as an example in this embodiment includes a first electrode, a second electrode, and an organic layer containing a light-emitting substance. One of the first electrode and the second electrode serves as an anode and the other serves as a cathode. The organic layer containing a light-emitting substance is provided between the first electrode and the second electrode, and a structure of the organic layer may be appropriately selected in accordance with a material and the polarities of the first electrode and second electrode. An example of a structure of the light-emitting body is described below; it is needless to say that a structure of the light-emitting body is not limited to the description.

<Structure Example 1 of Light-Emitting Body>

Figure 8A:
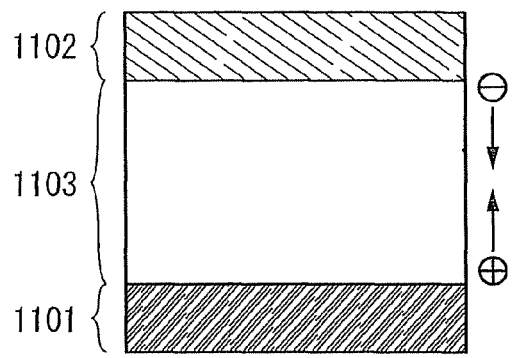
FIGS. 8A to 8C illustrate structures of a solid-state light-emitting body according to one embodiment of the present invention.

An example of a structure of the light-emitting body is illustrated in FIG. 8A. In a light-emitting body illustrated in FIG. 8A, an organic layer 1103 containing a light-emitting substance is interposed between an anode 1101 and a cathode 1102.

When voltage higher than threshold voltage is applied between the anode 1101 and the cathode 1102, holes are injected to the organic layer 1103 containing a light-emitting substance from the anode 1101 side and electrons are injected to the organic layer 1103 containing a light-emitting substance from the cathode 1102 side. The injected electrons and holes are recombined in the organic layer 1103 and the light-emitting substance contained in the organic layer 1103 emits light.

The organic layer 1103 containing a light-emitting substance may include at least a light-emitting layer containing a light-emitting substance, and may have a structure in which a layer other than the light-emitting layer and the light-emitting layer are stacked. Examples of the layer other than the light-emitting layer are layers containing a substance having a high hole-injection property, a substance having a high hole-transport property, a substance having a high electron-transport property, a substance having a high electron-injection property, a substance having a bipolar property (a substance having high electron-and-hole-transport properties), and the like. Specifically, a hole-injection layer, a hole-transport layer, a light-emitting layer, a hole-blocking layer, an electron-transport layer, an electron-injection layer, and the like are given, and they can be stacked as appropriate from the anode side.

<Structure Example 2 of Light-Emitting Body>

Figure 8B:
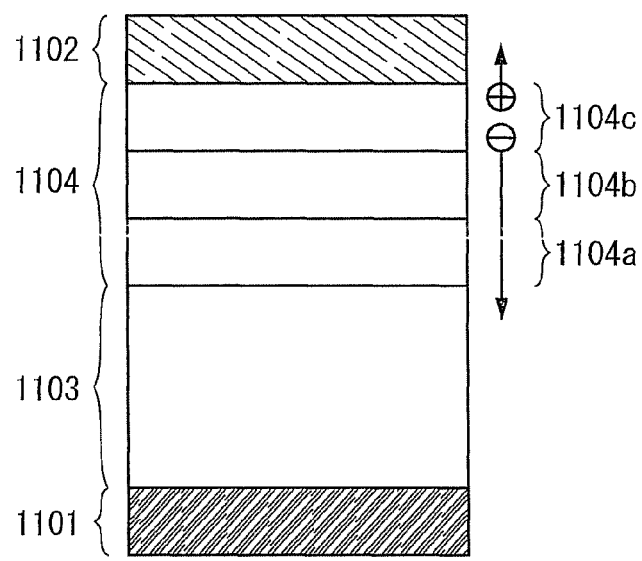

Another example of a structure of the light-emitting body is illustrated in FIG. 8B. In a light-emitting body illustrated as an example in FIG. 8B, the organic layer 1103 containing a light-emitting substance is interposed between the anode 1101 and the cathode 1102. Further, an intermediate layer 1104 is provided between the cathode 1102 and the organic layer 1103 containing a light-emitting substance. Note that a structure similar to that in the above structure example 1 of the light-emitting body can be applied to the organic layer 1103 containing a light-emitting substance in the structure example 2 of the light-emitting body, and for the details, the structure example 1 of the light-emitting body can be referred to.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The behaviors of electrons and holes in the intermediate layer 1104 are described. When voltage higher than threshold voltage is applied between the anode 1101 and the cathode 1102, in the first charge generation region 1104c, holes and electrons are generated, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier in injection of electrons into the organic layer 1103 containing a light-emitting substance, and the efficiency of the electron injection into the organic layer 1103 containing a light-emitting substance can be improved. Thus, the electrons generated in the first charge generation region 1104c are injected into the LUMO level of the organic layer 1103 containing a light-emitting substance through the electron-relay layer 1104b and the electron-injection buffer 1104a.

In addition, the electron-relay layer 1104b can prevent interaction in which the substance included in the first charge generation region 1104c and the substance included in the electron-injection buffer 1104a react with each other at the interface thereof and the functions of the first charge generation region 1104c and the electron-injection buffer 1104a are damaged.

<Structure Example 3 of Light-Emitting Body>

Figure 8C:
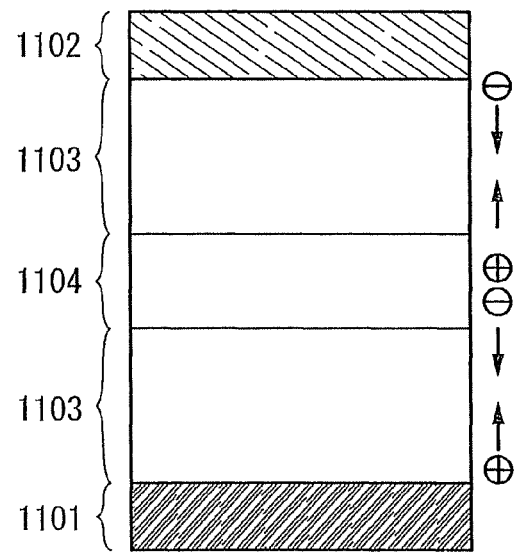

Another example of a structure of the light-emitting body is illustrated in FIG. 8C. In a light-emitting body illustrated as an example in FIG. 8C, two organic layers 1103 containing light-emitting substances are interposed between the anode 1101 and the cathode 1102. Further, the intermediate layer 1104 is provided between an organic layer 1103 containing a light-emitting substance and an organic layer 1103 containing a light-emitting substance. Note that the number of the organic layer containing a light-emitting substance which is interposed between the anode and cathode is not limited to two. A structure may be employed in which three or more organic layers containing light-emitting substances are stacked between the anode and cathode, with an intermediate layer interposed between the organic layers containing light-emitting substances. Note that a structure similar to that in the above structure example 1 of the light-emitting body can be applied to the organic layer 1103 containing a light-emitting substance in the structure example 3 of the light-emitting body; a structure similar to that in the above structure example 2 of the light-emitting body can be applied to the intermediate layer 1104 in the structure example 3 of the light-emitting body. Thus, for the details, the structure example 1 of the light-emitting body or the structure example 2 of the light-emitting body can be referred to.

The behaviors of electrons and holes in the intermediate layer 1104 provided between the organic layers 1103 containing light-emitting substances are described. When voltage higher than threshold voltage is applied between the anode 1101 and the cathode 1102, in the intermediate layer 1104, holes and electrons are generated, and the holes move into the organic layer 1103 containing a light-emitting substance which is provided on the cathode 1102 side and the electrons move into the organic layer 1103 containing a light-emitting substance which is provided on the anode 1101 side. The holes injected into the organic layer 1103 containing a light-emitting substance which is provided on the cathode 1102 side are recombined with the electrons injected from the cathode 1102 side, so that the light-emitting substance contained in the organic layer 1103 emits light. The electrons injected into the organic layer 1103 containing a light-emitting substance which is provided on the anode 1101 side are recombined with the holes injected from the anode 1101 side, so that the light-emitting substance contained in the organic layer 1103 emits light. Thus, the holes and electrons generated in the intermediate layer 1104 cause light emission in the respective organic layers 1103 containing light-emitting substances.

Note that in the case where a structure which is the same as an intermediate layer is formed between the organic layers containing light-emitting substances by providing the organic layers containing light-emitting substances that are in contact with each other, the organic layers containing light-emitting substances can be formed to be in contact with each other. Specifically, when a charge generation region is formed on one surface of the organic layer containing light-emitting substance, the charge generation region functions as a first charge generation region of an intermediate layer; thus, the organic layers containing light-emitting substances can be formed to be in contact with each other.

The structure examples 1 to 3 of the light-emitting body can be implemented in combination. For example, an intermediate layer may be provided between the cathode and the organic layer containing a light-emitting substance in the structure example 3 of the light-emitting body.

<Material for Light-Emitting Body>

Next, specific materials that can be used for the light-emitting body having the above-described structure will be described. Materials for the anode, the cathode, the organic layer containing a light-emitting substance, the first charge generation region, the electron-relay layer, and the electron-injection buffer will be described in this order.

<Material for Anode>

The anode 1101 is preferably formed using a metal, an alloy, an electrically conductive compound, a mixture of these materials, or the like which has a high work function (specifically, a work function of 4.0 eV or higher). Specific examples are given below: indium tin oxide (ITO), indium tin oxide containing silicon or silicon oxide, indium zinc oxide, and indium oxide containing tungsten oxide and zinc oxide.

Films of these conductive metal oxides are usually formed by sputtering; however, a sol-gel method or the like may also be used. For example, a film of indium zinc oxide can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, as a material for the anode 1101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used.

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge generation region will be described later together with a material for forming the first charge generation region.

<Material for Cathode>

In the case where the first charge generation region 1104c is provided between the cathode 1102 and the organic layer 1103 containing a light-emitting substance to be in contact with the cathode 1102, a variety of conductive materials can be used for the cathode 1102 regardless of their work functions.

Note that at least one of the cathode 1102 and the anode 1101 is formed using a conductive film that transmits visible light. For the conductive film that transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film having a thickness enough to transmit light (preferably, approximately 5 nm to 30 nm) can also be used.

<Material for Organic Layer Containing Light-Emitting Substance>

Specific examples of the materials for the layers included in the above organic layer 1103 containing a light-emitting substance will be described below.

The hole-injection layer is a layer containing a substance having a high hole-injection property. As a substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. A material for forming the second charge generation region will be described later together with a material for forming the first charge generation region.

The hole-transport layer is a layer containing a substance having a high hole-transport property. As the substance having a high hole-transport property, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Alternatively, any of the following carbazole derivatives can be used: 4,4'-di(N-carbazolyl)biphenyl (abbreviation: CBP); 1,3,5-tris[4-(N-carbazolyl)phenyl]benzene (abbreviation: TCPB); and 9-[4-(10-phenyl-9-anthracenyl)phenyl]-9H-carbazole (abbreviation: CzPA). The substances mentioned here are mainly ones that have a hole mobility of $10^{-6}$ $cm^2/Vs$ or higher. However, a substance other than the above substances may be used as long as it is a substance in which the hole-transport property is higher than the electron-transport property. The layer containing a substance having a high hole-transport property is not limited to a single layer, and two or more layers containing the aforementioned substances may be stacked.

In addition to the above substances, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used for the hole-transport layer.

The light-emitting layer is a layer containing a light-emitting substance. As the light-emitting substance, any of the following fluorescent compounds can be used. For example, the following can be given: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); N,N''-(2-tert-butyl anthracene-9,10-diyldi-4,1-phenylene)bis[N,N',N'-triphenyl-1,4-phenylenediamine] (abbreviation: DPABPA); N,9-diphenyl-N-[4-(9,10-diphenyl-2-anthryl)phenyl]-9H-carbazol-3-amine (abbreviation: 2PCAPPA); N-[4-(9,10-diphenyl-2-anthryl)phenyl]-N',N',N'-triphenyl-1,4-phenylenediamine (abbreviation: 2DPAPPA); N,N,N',N',N'',N'',N''',N'''-octaphenyldibenzo[g,p]chrysene-2,7,10,15-tetraamine (abbreviation: DBC1); coumarin 30; N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); coumarin 545T; N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl)tetracene-5,11-diamine (abbreviation: p-mPhTD); 7,14-diphenyl-N,N,N',N'-tetralcis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4- ylidene}propanedinitrile (abbreviation: BisDCJTM); and SD1 (product name; manufactured by SFC Co., Ltd).

As the light-emitting substance, any of the following phosphorescent compounds can also be used. The following can be given, for example: bis[2-(4',6'-difluorophenyl)pyridinato-N,C$^{2'}$]iridium(III) tetrakis(1-pyrazolyl)borate (abbreviation: FIr6); bis[2-(4',6'-difluorophenyl)pyridinato-N,C$^{2'}$]iridium(III) picolinate (abbreviation: FIrpic); bis[2-(3',5'-bistrifluoromethylphenyl)pyridinato-N,C$^{2'}$]iridium(III) picolinate (abbreviation: Ir(CF$_3$ppy)$_2$(pic)); bis[2-(4',6'-difluorophenyl)pyridinato-N,C$^{2'}$]iridium(III) acetylacetonate (abbreviation: FIracac); tris(2-phenylpyridinato)iridium(III) (abbreviation: Ir(ppy)$_3$); bis(2-phenylpyridinato)iridium(III) acetylacetonate (abbreviation: Ir(ppy)$_2$(acac)); bis(benzo[h]quinolinato)iridium(III) acetylacetonate (abbreviation: Ir(bzq)$_2$(acac)); bis(2,4-diphenyl-1,3-oxazolato-N,C$^{2'}$)iridium(III) acetylacetonate (abbreviation: Ir(dpo)$_2$(acac)); bis[2-(4'-perfluorophenylphenyl)pyridinato]iridium(III) acetylacetonate (abbreviation: Ir(p-PF-ph)$_2$(acac)); bis(2-phenylbenzothiazolato-N,C$^{2'}$)iridium(III) acetylacetonate (abbreviation: Ir(bt)$_2$(acac)); bis[2-(2'-benzo[4,5-α]thienyl)pyridinato-N,C$^{3'}$]iridium(III) acetylacetonate (abbreviation: Ir(btp)$_2$(acac)); bis(1-phenylisoquinolinato-N,C$^{2'}$)iridium(III) acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); (acetylacetonato)bis(2,3,5-triphenylpyrazinato)iridium(III) (abbreviation: Ir(tppr)$_2$(acac)); 2,3,7,8,12,13,17,18-octaethyl-21H,23H-porphyrin platinum(II) (abbreviation: PtOEP); tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); tris[1-(2-thenoyl)-3,3,3-trifluoroacetonato](monophenanthroline)europium(III) (abbreviation: Eu(TTA)$_3$(Phen)); and (dipivaloylmethanato)bis(2,3,5-triphenylpyrazinato)iridium(III) (abbreviation: Ir(tppr)$_2$(dpm)).

Note that those light-emitting substances are preferably dispersed in a host material. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), CzPA (abbreviation), 9-phenyl-3-[4-(10-phenyl-9-anthryl)phenyl]-9H-carbazole (abbreviation: PCzPA), or 4-phenyl-4'-(9-phenyl-9H-carbazol-3-yl)triphenylamine (abbreviation: PCBA1BP); a substance having a high hole-transport property which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq); a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$); or a substance having a high electron-transport property, such as 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

The electron-transport layer is a layer containing a substance having a high electron-transport property. As the substance having a high electron-transport property, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. In addition to the above, a metal complex having an oxazole-based or thiazole-based ligand, such as Zn(BOX)$_2$ (abbreviation) or Zn(BTZ)$_2$ (abbreviation) can also be used. Further, besides the metal complex, PBD (abbreviation), OXD-7 (abbreviation), CO11 (abbreviation), TAZ (abbreviation), BPhen (abbreviation), BCP (abbreviation), 2-[4-(dibenzothiophen-4-yl)phenyl]-1-phenyl-1H-benzimidazole (abbreviation: DBTBIm-II), or the like can also be used. The substances mentioned here are mainly ones that have an electron mobility of $10^{-6}$ cm$^2$/Vs or higher. Note that a substance other than the above substances may be used as long as it is a substance in which the electron-transport property is higher than the hole-transport property. Further, the electron-transport layer is not limited to a single layer, and may have a structure in which two or more layers containing the aforementioned substances are stacked.

Alternatively, a high molecular compound can be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injection layer is a layer containing a substance having a high electron-injection property. As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a layer containing a substance having an electron-transport property and an alkali metal, an alkaline earth metal, or a compound thereof (e.g., Alq containing magnesium (Mg)) can be used. Such a structure makes it possible to increase the efficiency of the electron injection from the cathode 1102.

As a method for forming the organic layer 1103 containing a light-emitting substance by combining these layers as appropriate, any of a variety of methods (e.g., a dry process and a wet process) can be selected as appropriate. For example, a vacuum evaporation method, an inkjet method, a spin coating method, or the like may be selected in accordance with a material to be used. Note that a different formation method may be employed for each layer.

<Material for Charge Generation Region>

The first charge generation region 1104c and the second charge generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region 1104c is provided on the cathode side, the layer containing the substance having a high hole-transport property is in contact with the cathode 1102, and in the case of a stacked-layer structure in which the second charge generation region is provided on the anode side, the layer containing the acceptor substance is in contact with the anode 1101.

Note that the acceptor substance is preferably added to the charge generation region so that the mass ratio of the acceptor substance to the substance having a high hole-transport property is greater than or equal to 0.1:1 and less than or equal to 4.0:1.

As the acceptor substance that is used for the charge generation region, a transition metal oxide and an oxide of a metal belonging to Groups 4 to 8 of the periodic table can be given. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ cm$^2$/Vs or higher is preferably used. However, a substance other than the above substances may be used as long as it is a substance in which the hole-transport property is higher than the electron-transport property.

<Material for Electron-Relay Layer>

The electron-relay layer 1104b is a layer that can immediately receive electrons drawn out by the acceptor substance in the first charge generation region 1104c. Therefore, the electron-relay layer 1104b is a layer containing a substance having a high electron-transport property, and the LUMO level thereof is positioned between the acceptor level of the acceptor substance in the first charge generation region 1104c and the LUMO level of the organic layer 1103 containing a light-emitting substance. Specifically, it is preferable that the LUMO level of the electron-relay layer 1104b be approximately greater than or equal to −5.0 eV and less than or equal to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or a fluoro group is preferably used because such a compound further facilitates reception of electrons in the electron-relay layer 1104b.

As specific examples of the perylene derivative, the following can be given: 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophen (abbreviation: DCMT), methanofullerenes (e.g., [6,6]-phenyl C$_{61}$ butyric acid methyl ester), or the like can be used for the electron-relay layer 1104b.

<Material for Electron-Injection Buffer>

The electron-injection buffer 1104a is a layer which facilitates electron injection from the first charge generation region 1104c into the organic layer 1103 containing a light-emitting substance. The provision of the electron-injection buffer 1104a between the first charge generation region 1104c and the organic layer 1103 containing a light-emitting substance makes it possible to reduce the injection barrier therebetween.

A substance having a high electron-injection property can be used for the electron-injection buffer 1104a. For example, an alkali metal, an alkaline earth metal, a rare earth metal, a compound thereof (e.g., an alkali metal compound (including an oxide such as lithium oxide, a halide, and carbonate such as lithium carbonate or cesium carbonate), an alkaline earth metal compound (including an oxide, a halide, and carbonate), or a rare earth metal compound (including an oxide, a halide, and carbonate)) can be used.

Further, in the case where the electron-injection buffer 1104a contains a substance having a high electron-transport property and a donor substance, the donor substance is preferably added so that the mass ratio of the donor substance to the substance having a high electron-transport property is greater than or equal to 0.001:1 and less than or equal to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound thereof (e.g., an alkali metal compound (including an oxide such as lithium oxide, a halide, and carbonate such as lithium carbonate or cesium carbonate), an alkaline earth metal compound (including an oxide, a halide, and carbonate), and a rare earth metal compound (including an oxide, a halide, and carbonate)). Note that as the substance having a high electron-transport property, a material similar to the above-described material for the electron-transport layer that can be formed in part of the organic layer 1103 containing a light-emitting substance can be used.

The light-emitting body described in this embodiment can be manufactured by combination of the above-described materials. Light emission from the above-described light-emitting substance can be obtained with this light-emitting body, and the emission color can be selected by changing the type of the light-emitting substance. Further, a plurality of light-emitting substances which emit light of different colors can be used, whereby, for example, white light emission can also be obtained by expanding the width of the emission spectrum. Note that in order to obtain white light emission, light-emitting substances whose emission colors are complementary may be used; for example, different layers whose emission colors are complementary can be used. Specific examples of complementary colors include "blue and yellow", "blue-green and red", and the like.

This embodiment can be combined as appropriate with any of the other embodiments in this specification.

Embodiment 4

In this embodiment, examples of an electronic device will be described.

Figure 9A:
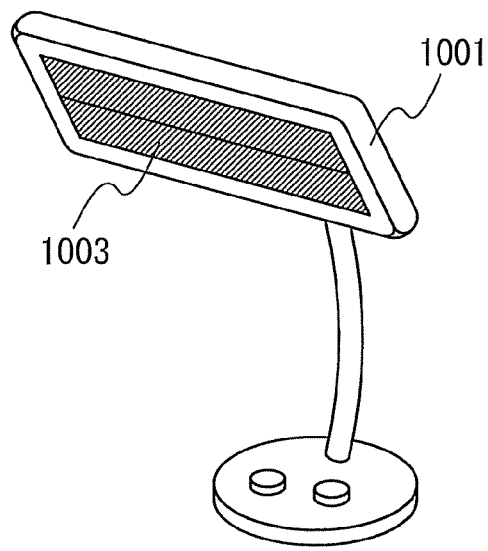
FIGS. 9A and 9B each illustrate a lighting device using a solid-state light-emitting device according to one embodiment of the present invention.

FIG. 9A illustrates an example in which the light-emitting device according to the present invention is used for a desk lamp which is a lighting device. The desk lamp includes a housing 1001 and a light source 1003. The light-emitting device according to the present invention is used as the light source 1003.

Figure 9B:
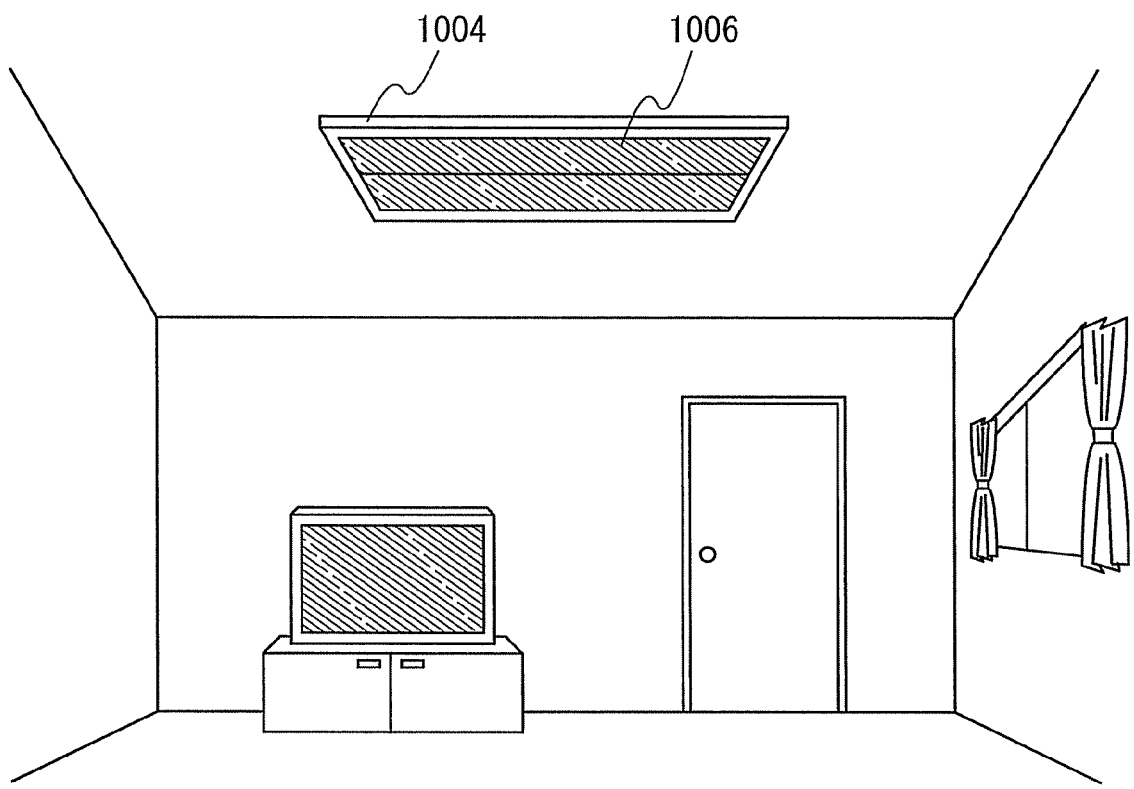

FIG. 9B illustrates an example in which the light-emitting device according to the present invention is used for an indoor lighting device. The lighting device includes a housing 1004 and a light source 1006. The light-emitting device according to the present invention is used as the light source 1006.

This embodiment can be combined with any of the other embodiments as appropriate.

REFERENCE NUMERALS

101: first electrode, 101b: first electrode, 102: second electrode, 102b: second electrode, 103: layer, 103b: layer, 104: conductive film, 140: partition, 140b: partition, 150: member, 151: hemispherical structure, 152: uneven structure, 153: support, 160: bonding layer, 165: surface including light-emitting surface, 170: solid-state light-emitting body, 170b: solid-state light-emitting body, 171: outside shape, 180: solid-state light-emitting element, 180b: solid-state light-emitting element, 190: solid-state light-emitting device, 201: first electrode, 202: second electrode, 203: layer, 204 conductive film, 240: partition, 250: member, 251: hemispherical structure, 252: hemispherical depression structure, 260: bonding layer, 265: surface including light-emitting surface, 270: solid-state light-emitting body, 270a: subordinate-solid-state light-emitting body, 270b: subordinate-solid-state light-emitting body, 270c: subordinate-solid-state light-emitting body, 271: outside shape, 271c: outside shape, 280: solid-state light-emitting element, 290: solid-state light-emitting device, 350: member, 351: hemispherical structure, 360: bonding layer, 370: solid-state light-emitting body, 380: solid-state light-emitting element, 390: solid-state light-emitting device, 450: member, 451: hemispherical structure, 460: bonding layer, 470: solid-state light-emitting body, 480: solid-state light-emitting element, 490: solid-state light-emitting device, 1001: housing, 1003: light source, 1004: housing, 1006: light source, 1101: anode, 1102: cathode, 1103: organic layer, 1104: intermediate layer, 1104a: electron-injection buffer, 1104b: electron-relay layer, and 1104c: first charge generation region This application is based on Japanese Patent Application serial no. 2010-237647 filed with Japan Patent Office on Oct. 22, 2010, the entire contents of which are hereby incorporated by reference.

The invention claimed is:

1. A light-emitting element comprising:
a member comprising a hemispherical structure on a first surface and an uneven structure on a second surface;
a bonding layer planarizing the uneven structure; and
a light-emitting body having a light-emitting surface in contact with a flat surface of the bonding layer,
wherein the bonding layer has a higher refractive index than the member,
wherein the uneven structure of the member is provided at least in a region overlapping with the hemispherical structure,
wherein the light-emitting body is provided such that an outside shape of a light-emitting region of the light-emitting body projected on a surface including the light-emitting surface is smaller than an outside shape of the hemispherical structure projected on the surface including the light-emitting surface and overlaps with the hemispherical structure,
wherein the outside shape of the light-emitting region of the light-emitting body is concentric with the outside shape of the hemispherical structure, and
wherein the outside shape of the light-emitting region of the light-emitting body and the outside shape of the hemispherical structure are similar in shape.

2. The light-emitting element according to claim 1,
wherein a refractive index of the hemispherical structure is n, and
wherein the outside shape of the light-emitting region of the light-emitting body is included in a range (1/n) times as large as the outside shape of the hemispherical structure.

3. The light-emitting element according to claim 1,
wherein the refractive index of the member is higher than 1.0 and lower than 1.6, and
wherein the refractive index of the bonding layer is higher than or equal to 1.6 and lower than or equal to 1.9.

4. The light-emitting element according to claim 1, wherein the light-emitting body comprises:
a first electrode over the flat surface of the bonding layer;
a second electrode overlapping with the first electrode; and
a layer containing a light-emitting organic substance between the first electrode and the second electrode,
wherein the first electrode transmits light emitted by the light-emitting organic substance.

5. The light-emitting element according to claim 1 further comprising a nitride film with a refractive index of higher than or equal to 1.6 and lower than or equal to 1.9 between the bonding layer and the light-emitting body.

6. The light-emitting element according to claim 1, wherein the hemispherical structure comprises a base having a polygonal shape and a cross section passing through a peak of the hemispherical structure includes an arc.

7. A light-emitting device wherein a plurality of the light-emitting elements according to claim 1 are arranged.

8. A lighting device comprising the light-emitting element according to claim 1.

9. The light-emitting element according to claim 1,
wherein the member further comprises a support;
wherein the hemispherical structure is provided on one surface of the support and the uneven structure is provided on the other surface; and
wherein a refractive index difference between the support and the hemispherical structure and a refractive index difference between the support and the uneven structure are each 0.15 or lower.

10. The light-emitting element according to claim 9,
wherein at least one of the hemispherical structure and the uneven structure is molded with the support.

11. A light-emitting element comprising:
a member comprising a hemispherical structure on a first surface and an hemispherical depression structure on a second surface;
a bonding layer planarizing the hemispherical depression structure; and
a light-emitting body having a light-emitting surface in contact with a flat surface of the bonding layer,
wherein the light-emitting body comprises a plurality of subordinate light-emitting bodies,
wherein the bonding layer has a higher refractive index than the member,
wherein the hemispherical depression structure of the member is provided at least in a region overlapping with the hemispherical structure,
wherein the light-emitting body is provided such that an outside shape of a light-emitting region of each of the plurality of subordinate light-emitting bodies projected on a surface including the light-emitting surface is smaller than an outside shape of the hemispherical structure projected on the surface including the light-emitting surface and overlaps with the hemispherical structure, wherein each of the plurality of subordinate light-emitting bodies is provided so as to overlap with a hemispherical depression included in the hemispherical depression structure, wherein the outside shape of the light-emitting region of the light-emitting body is concentric with the outside shape of the hemispherical structure, and wherein the outside shape of the light-emitting region of the light-emitting body and the outside shape of the hemispherical structure are similar in shape.

12. The light-emitting element according to claim 11, wherein a refractive index of the hemispherical structure is n, and wherein the outside shape of the light-emitting region of the light-emitting body is included in a range (1/n) times as large as the outside shape of the hemispherical structure.

13. The light-emitting element according to claim 11, wherein the refractive index of the member is higher than 1.0 and lower than 1.6, and wherein the refractive index of the bonding layer is higher than or equal to 1.6 and lower than or equal to 1.9.

14. The light-emitting element according to claim 11, wherein each of the plurality of subordinate light emitting bodies comprises:

a first electrode over the flat surface of the bonding layer;
a second electrode overlapping with the first electrode; and
a layer containing a light-emitting organic substance between the first electrode and the second electrode,
wherein the first electrode transmits light emitted by the light-emitting organic substance.

15. The light-emitting element according to claim 11 further comprising a nitride film with a refractive index of higher than or equal to 1.6 and lower than or equal to 1.9 between the bonding layer and the light-emitting body.

16. The light-emitting element according to claim 11, wherein the hemispherical structure comprises a base having a polygonal shape and a cross section passing through a peak of the hemispherical structure includes an arc.

17. A light-emitting device wherein a plurality of the light-emitting elements according to claim 11 are arranged.

18. A lighting device comprising the light-emitting element according to claim 11.

19. The light-emitting element according to claim 11, wherein the member further comprises a support;

wherein the hemispherical structure is provided on one surface of the support and the hemispherical depression structure is provided on the other surface; and wherein a refractive index difference between the support and the hemispherical structure and a refractive index difference between the support and the hemispherical depression structure are each 0.15 or lower.

20. The light-emitting element according to claim 19, wherein at least one of the hemispherical structure and the hemispherical depression structure is molded with the support.

21. A light-emitting element comprising:

a member having a first side and a second side, wherein the first side comprises a hemispherical projection and the second side comprises a plurality of depressions;

a bonding layer over the second side of the member, wherein the bonding layer fills the plurality of depressions and forms a flat surface; and a light-emitting body over and in contact with the flat surface of the bonding layer, wherein the bonding layer has a higher refractive index than the member, wherein an area occupied by the plurality of depressions is smaller than an area occupied by a base of the hemispherical projection, wherein the plurality of depressions overlap with the hemispherical projection, wherein the outside shape of a light-emitting region of the light-emitting body is concentric with the outside shape of the hemispherical structure, and wherein the outside shape of the light-emitting region of the light-emitting body and the outside shape of the hemispherical structure are similar in shape.

22. The light-emitting element according to claim 21, wherein the refractive index of the member is higher than 1.0 and lower than 1.6, and wherein the refractive index of the bonding layer is higher than or equal to 1.6 and lower than or equal to 1.9.

23. The light-emitting element according to claim 21, wherein the light-emitting body comprises:

a first electrode over the flat surface of the bonding layer;
a second electrode over the first electrode; and
a layer containing a light-emitting organic substance between the first electrode and the second electrode,
wherein the first electrode transmits light emitted by the light-emitting organic substance.

24. The light-emitting element according to claim 21 further comprising a nitride film with a refractive index of higher than or equal to 1.6 and lower than or equal to 1.9 between the bonding layer and the second side of the member.

25. The light-emitting element according to claim 21, wherein the member comprises at least two parts, and wherein a refractive index difference between the parts is 0.15 or lower.

26. The light-emitting element according to claim 21, wherein the base of the hemispherical projection has a polygonal shape and a cross section passing through a peak of the hemispherical projection includes an arc.

27. A light-emitting device wherein a plurality of the light-emitting elements according to claim 21 are arranged.

28. A lighting device comprising the light-emitting element according to claim 21.

* * * * *